(12) United States Patent
Shimofuku et al.

(10) Patent No.: US 11,145,803 B2
(45) Date of Patent: Oct. 12, 2021

(54) PIEZOELECTRIC ELEMENT SUBSTRATE, BONDED SUBSTRATE, LIQUID DISCHARGE HEAD, LIQUID DISCHARGE UNIT, AND LIQUID DISCHARGE APPARATUS

(71) Applicant: Ricoh Company, Ltd., Tokyo (JP)

(72) Inventors: Akira Shimofuku, Kanagawa (JP); Keishi Miwa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/935,290

(22) Filed: Jul. 22, 2020

(65) Prior Publication Data
US 2021/0036208 A1 Feb. 4, 2021

(30) Foreign Application Priority Data

Jul. 30, 2019 (JP) .............................. JP2019-139677
Feb. 25, 2020 (JP) .............................. JP2020-029761
Apr. 22, 2020 (JP) .............................. JP2020-075975

(51) Int. Cl.
*H01L 41/04* (2006.01)
*H01L 41/047* (2006.01)
*H01L 41/08* (2006.01)
*B41J 2/14* (2006.01)
*H01L 41/09* (2006.01)

(52) U.S. Cl.
CPC ...... *H01L 41/0475* (2013.01); *B41J 2/14201* (2013.01); *H01L 41/081* (2013.01); *H01L 41/09* (2013.01)

(58) Field of Classification Search
None
See application file for complete search history.

(56) References Cited

U.S. PATENT DOCUMENTS

| | | | |
|---|---|---|---|
| 2008/0180490 A1* | 7/2008 | Murata | ............... B41J 2/14233 347/70 |
| 2011/0175967 A1 | 7/2011 | Machida et al. | |
| 2011/0205307 A1 | 8/2011 | Ueda et al. | |
| 2012/0038712 A1 | 2/2012 | Akiyama et al. | |
| 2012/0236084 A1 | 9/2012 | Watanabe et al. | |
| 2012/0276303 A1 | 11/2012 | Watanabe et al. | |
| 2012/0314007 A1 | 12/2012 | Shimofuku et al. | |

(Continued)

FOREIGN PATENT DOCUMENTS

| | | |
|---|---|---|
| JP | 2007-006620 | 1/2007 |
| JP | 2014-151537 | 8/2014 |
| JP | 2016-016522 | 2/2016 |

*Primary Examiner* — Erica S Lin
(74) *Attorney, Agent, or Firm* — Xsensus LLP

(57) ABSTRACT

A piezoelectric element substrate is provided. The piezoelectric element substrate includes: a substrate member; a plurality of piezoelectric elements on the substrate member; a plurality of wiring patterns on one side of the substrate member on which the plurality of piezoelectric elements is disposed; and a bonding pattern in a region different from the wiring patterns on the one side of the substrate member. Each of the piezoelectric elements includes a first electrode, a piezoelectric body, and a second electrode. The wiring patterns are connected to the corresponding piezoelectric elements. The bonding pattern is to be bonded to another substrate directly or via an insulating film, and is made of a metal layer having a plurality of slots.

19 Claims, 23 Drawing Sheets

(56) References Cited

U.S. PATENT DOCUMENTS

| | | |
|---|---|---|
| 2013/0070028 A1 | 3/2013 | Watanabe et al. |
| 2013/0169713 A1 | 7/2013 | Takeuchi et al. |
| 2013/0176364 A1 | 7/2013 | Machida et al. |
| 2013/0194350 A1 | 8/2013 | Watanabe et al. |
| 2014/0049582 A1 | 2/2014 | Machida et al. |
| 2014/0210913 A1 | 7/2014 | Shimofuku et al. |
| 2014/0340854 A1 | 11/2014 | Akiyama et al. |
| 2014/0375728 A1 | 12/2014 | Machida et al. |
| 2015/0145924 A1 | 5/2015 | Shimofuku et al. |
| 2015/0307403 A1 | 10/2015 | Takeuchi et al. |
| 2016/0049579 A1 | 2/2016 | Shimofuku et al. |
| 2016/0221033 A1 | 8/2016 | Akiyama et al. |
| 2017/0100934 A1* | 4/2017 | Masuda ................ B41J 2/1623 |
| 2017/0211202 A1 | 7/2017 | Akiyama et al. |
| 2017/0362127 A1 | 12/2017 | Takeuchi et al. |
| 2018/0117915 A1 | 5/2018 | Takeuchi et al. |

\* cited by examiner

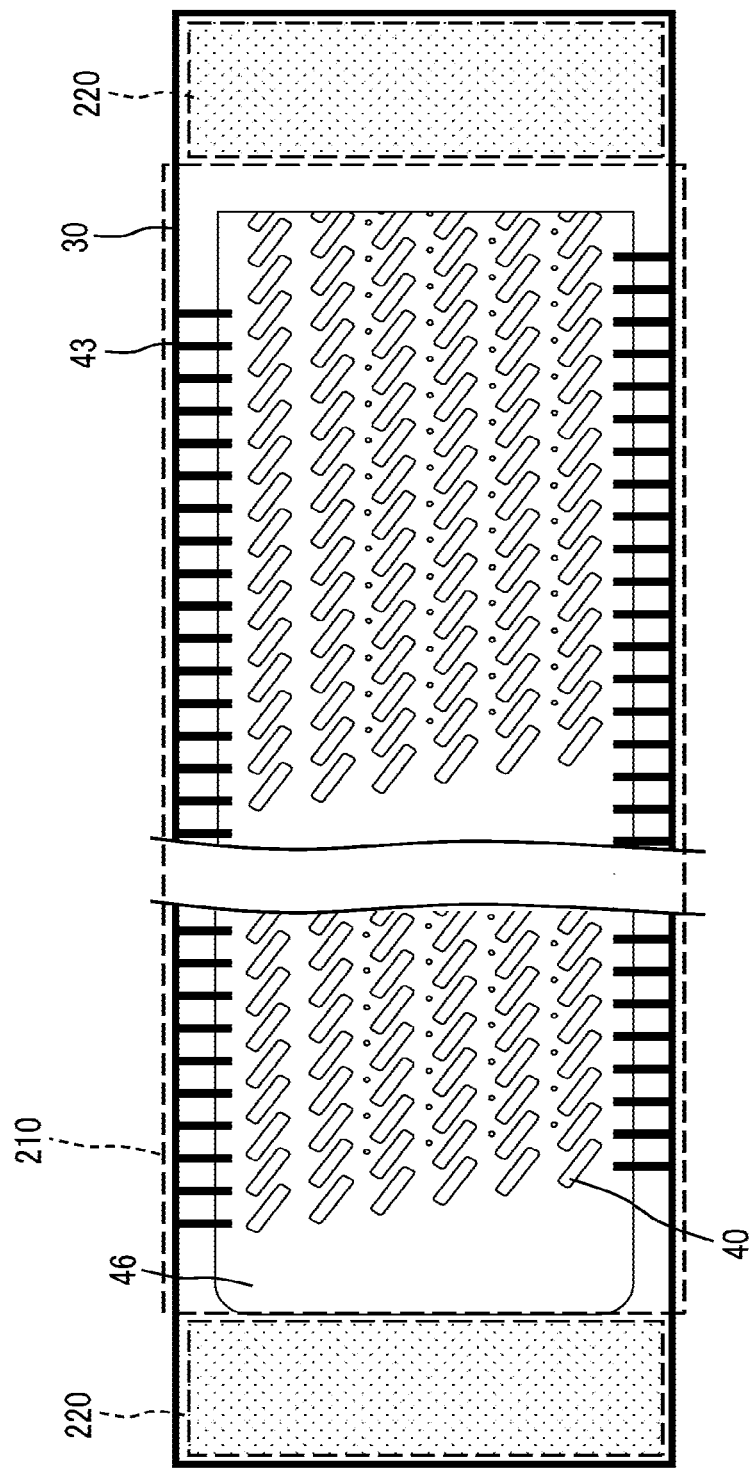

PIEZOELECTRIC ELEMENT SUBSTRATE, BONDED SUBSTRATE, LIQUID DISCHARGE HEAD, LIQUID DISCHARGE UNIT, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application Nos. 2019-139677, 2020-029761, and 2020-075975, filed on Jul. 30, 2019, Feb. 25, 2020, and Apr. 22, 2020, respectively, in the Japan Patent Office, the entire disclosure of each of which is hereby incorporated by reference herein.

BACKGROUND

Technical Field

The present disclosure relates to a piezoelectric element substrate, a bonded substrate, a liquid discharge head, a liquid discharge unit, and a liquid discharge apparatus.

Description of the Related Art

A liquid discharge head using an actuator substrate as an electromechanical transducer element is known. Such a liquid discharge head has a configuration in which a lower electrode, a piezoelectric body, and an upper electrode are laminated in this order on a vibration plate. The upper and lower electrodes are applied with a voltage to cause the piezoelectric body as an electromechanical transducer film to deform, and the liquid discharge head thereby discharges ink via the vibration plate.

The actuator substrate is composed of a piezoelectric element and a metal layer. The piezoelectric element is composed of the lower electrode, the piezoelectric body, and the upper electrode.

Conventionally, the metal layer is provided with a wiring pattern for connecting to individual electrodes of the piezoelectric element and a bonding pattern made of a solid film having a relatively large area. To the bonding pattern formed on the metal layer, another substrate such as a subframe is bonded directly or via an insulating film. Prior to this bonding, a bonding region including the bonding pattern is subjected to organic peeling cleaning using, for example, an amine solvent.

However, in the cleaning, the surface of the bonding pattern having a relatively large area gets partially eroded to generate crater-like defects, resulting in a defective bonding between the bonding pattern and said another substrate.

SUMMARY

In accordance with some embodiments of the present invention, a piezoelectric element substrate is provided. The piezoelectric element substrate includes: a substrate member; a plurality of piezoelectric elements on the substrate member; a plurality of wiring patterns on one side of the substrate member on which the plurality of piezoelectric elements is disposed; and a bonding pattern in a region different from the wiring patterns on the one side of the substrate member. Each of the piezoelectric elements includes a first electrode, a piezoelectric body, and a second electrode. The wiring patterns are connected to the corresponding piezoelectric elements. The bonding pattern is to be bonded to another substrate directly or via an insulating film, and is made of a metal layer having a plurality of slots.

In accordance with some embodiments of the present invention, a bonded substrate is provided. The bonded substrate includes the above-described piezoelectric element substrate and another substrate bonded to the bonding pattern of the piezoelectric element substrate directly or via an insulating film.

In accordance with some embodiments of the present invention, a liquid discharge head including the above-described bonded substrate is provided.

In accordance with some embodiments of the present invention, a liquid discharge unit including the above-described liquid discharge head is provided.

In accordance with some embodiments of the present invention, a liquid discharge apparatus including the above-described liquid discharge head is provided.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 23 is a diagram schematically illustrating a surface of a vibration plate of the liquid discharge head according to the sixth embodiment, to be bonded to the subframe;

Figure 1:
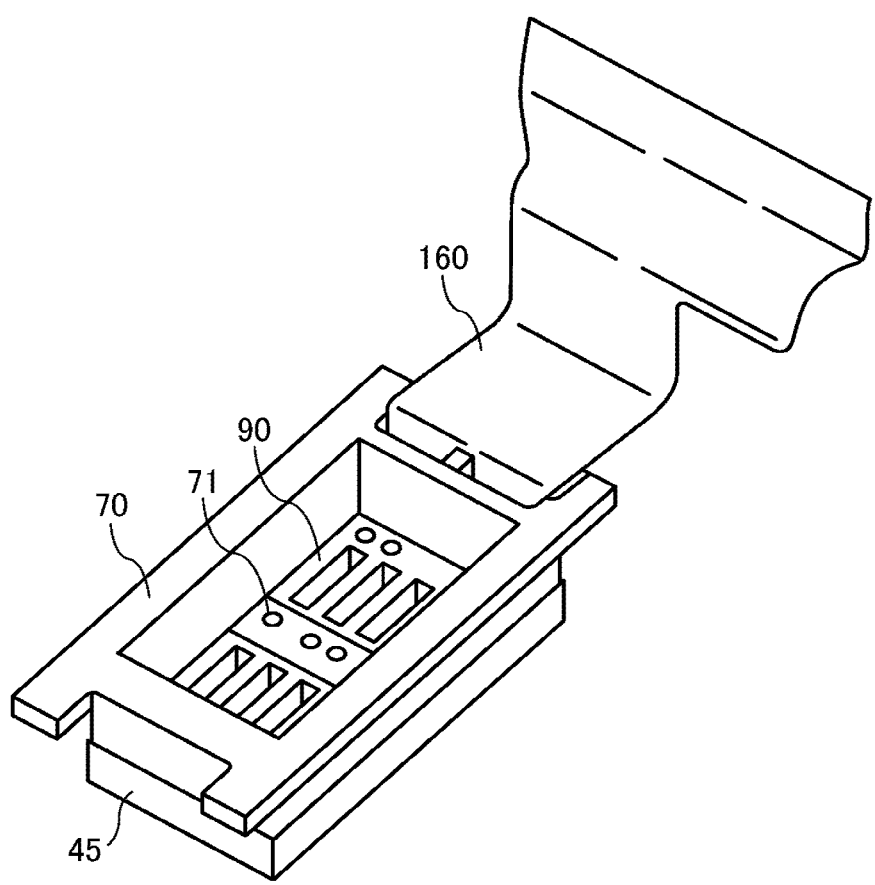
FIG. 1 is a perspective view of a liquid discharge head according to an embodiment of the present invention.
Figure 2:
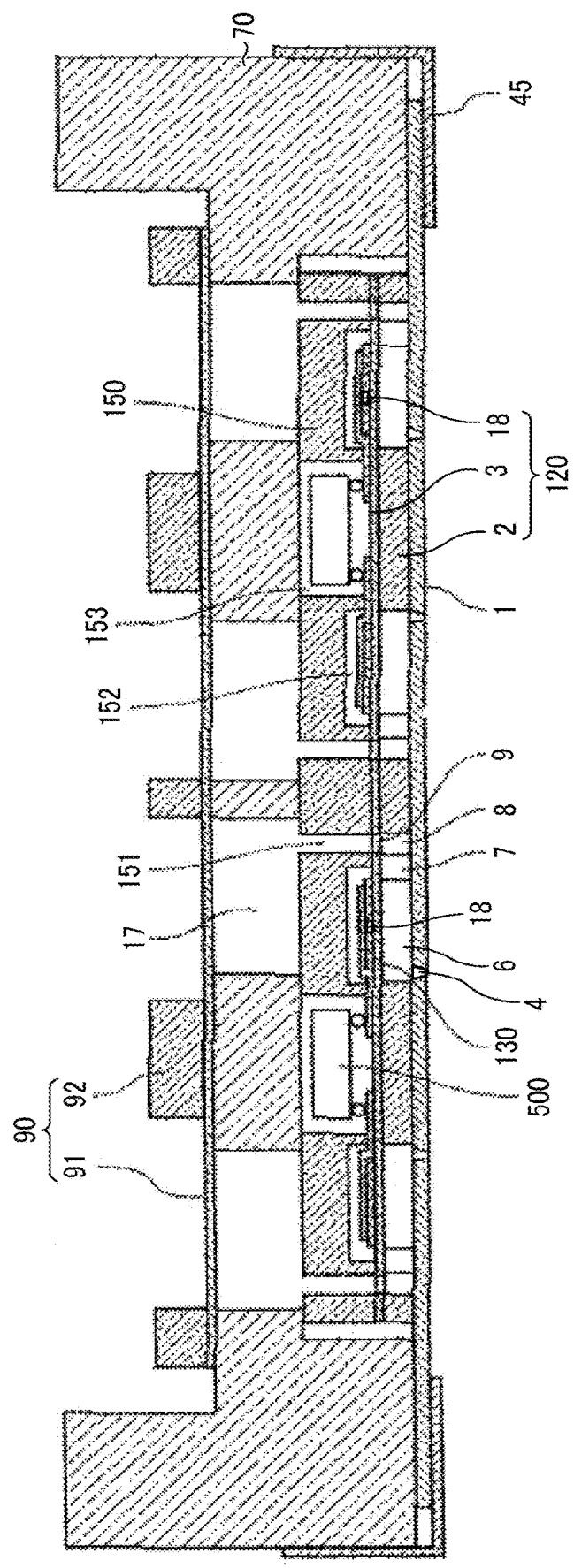
FIG. 2 is a cross-sectional view of a main part of the liquid discharge head in a direction orthogonal to the nozzle array direction.

The accompanying drawings are intended to depict example embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the present invention are described in detail below with reference to accompanying drawings. In describing embodiments illustrated in the drawings, specific terminology is employed for the sake of clarity. However, the disclosure of this patent specification is not intended to be limited to the specific terminology so selected, and it is to be understood that each specific element includes all technical equivalents that have a similar function, operate in a similar manner, and achieve a similar result.

For the sake of simplicity, the same reference number will be given to identical constituent elements such as parts and materials having the same functions and redundant descriptions thereof omitted unless otherwise stated.

According to some embodiments of the present invention, the bonding between a piezoelectric element substrate and another substrate can be improved.

Embodiments of the present invention are described below with reference to the drawings. For clarity, the following descriptions and drawings are appropriately omitted or simplified. In each drawing, the same reference numerals are given to the same components and corresponding parts having the same configurations or functions, and redundant explanation will be omitted.

As described above, in the cleaning process, crater-like defects (recesses) are generated on the solid film occupying a large area of the metal layer. The generation of defects (recesses) may cause the following problems.

When foreign matter is present on the solid film occupying the large area of the metal layer, the foreign matter is caught and trapped in a void pattern (to be described later) of a subframe with an adhesive at the time of bonding the subframe to the solid film with the adhesive, reducing the yield of the actuator substrate.

The recesses may be misidentified as foreign matter in inspecting the bonding surface on the actuator substrate before being bonded to the subframe. As a result, the actuator substrate may be mistakenly recognized as a defective product, and the yield of the actuator substrate is reduced.

The generation of the recesses increases the film stress of the metal layer. Further, as the surface roughness increases due to the unevenness of the surface, the bonding strength between the metal layer and the subframe decreases. As a result, film peeling occurs when the actuator substrate is driven.

In a piezoelectric element substrate according to an embodiment of the present invention, the metal layer is provided with, in addition to individual wiring patterns corresponding to piezoelectric elements, another pattern in a large area.

Specifically, a piezoelectric element substrate according to an embodiment of the present invention includes: a substrate member; a plurality of piezoelectric elements in each of which a first electrode as a lower electrode, a piezoelectric body as an electromechanical transducer film, and a second electrode as an upper electrode are laminated; and a metal layer formed on the substrate member via an interlayer insulating film.

The metal layer (hereinafter also referred to as "metal wiring layer") is provided with a plurality of wiring patterns (individual wirings) connected to the corresponding piezoelectric elements. The metal layer is also provided with a bonding pattern in a region different from the wiring patterns, to be bonded to another substrate directly or via an insulating film. The bonding pattern is a pattern having a plurality of slots formed on the metal layer. The bonding pattern is provided in a bonding region where the metal layer and another substrate are bonded to each other.

The slot is a portion where no metal is present, and the interlayer insulating film is exposed at the slot.

The piezoelectric element substrate can be configured as an actuator substrate including a vibration plate or the like in addition to the plurality of piezoelectric elements and the metal wiring layer described above.

First, a liquid discharge head including the piezoelectric element substrate according to an embodiment as an actuator substrate is described below.

Embodiments of the present invention are described in detail below with reference to the drawings. A liquid discharge head including the piezoelectric element substrate according to an embodiment as an actuator substrate is described below with reference to FIGS. 1 to 4. FIG. 1 is an exploded perspective view of the liquid discharge head. FIG.

Figure 3:
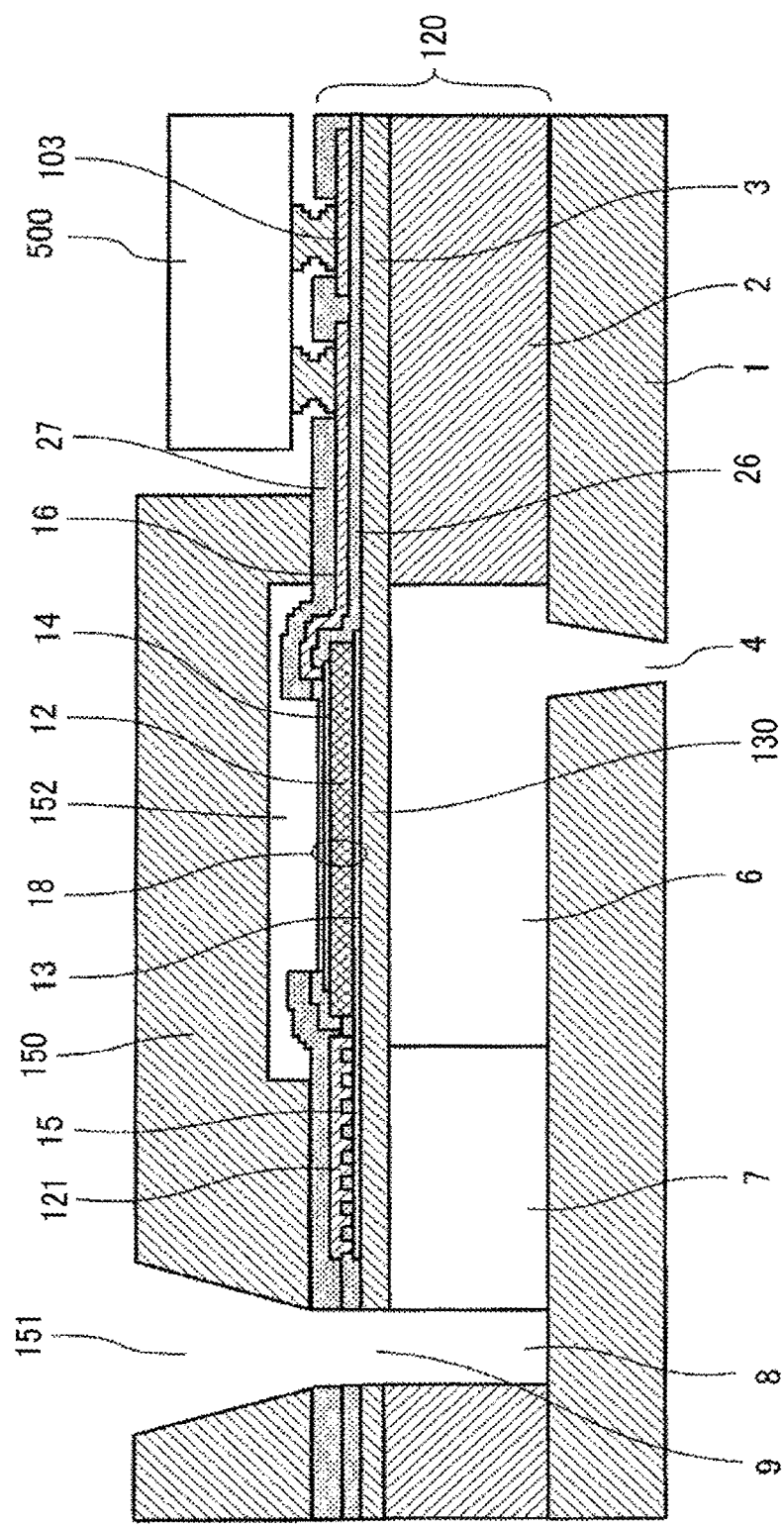
FIG. 3 is an enlarged cross-sectional view of a main part of FIG. 2.
Figure 4:
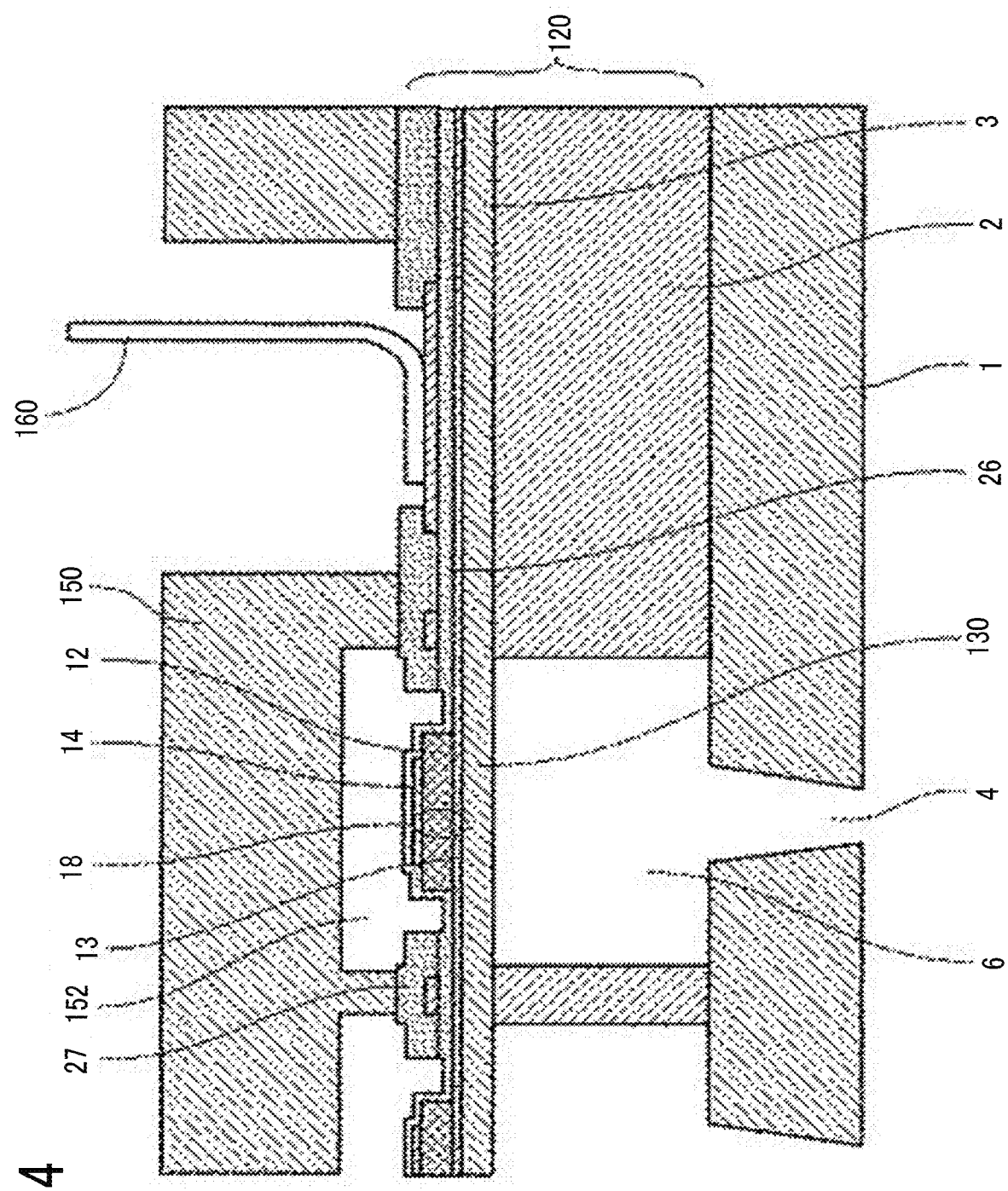
FIG. 4 is a cross-sectional view of a main part of the liquid discharge head in the nozzle array direction.

2 is a cross-sectional view of the liquid discharge head in a direction orthogonal to the nozzle array direction. FIG. 3 is an enlarged cross-sectional view of a main part of FIG. 2. FIG. 4 is a cross-sectional view of a main part of the liquid discharge head in the nozzle array direction.

The liquid discharge head includes a nozzle plate 1, a channel plate 2, a vibration plate 3, a piezoelectric element 18 as a pressure generating element, a subframe 150 as a holding substrate, a wiring member 160, and a frame 70 as a common liquid chamber member.

The channel plate 2, the vibration plate 3, and the piezoelectric element 18 constitute an actuator substrate 120 according to an embodiment of the present invention. Even in a case in which the actuator substrate 120 is an independent member, the nozzle plate 1 and the subframe 150 bonded to the actuator substrate 120 do not constitute a part of the actuator substrate 120.

The nozzle plate 1 has a plurality of nozzles 4 for discharging liquid. In the present embodiment, four nozzle arrays are arranged, in each of which the nozzles 4 are arranged.

The channel plate 2 forms, together with the nozzle plate 1 and the vibration plate 3, an individual liquid chamber 6 communicating with the nozzle 4, a fluid restrictor 7 communicating with the individual liquid chamber 6, and a liquid introducing channel 8 communicating with the fluid restrictor 7.

The liquid introducing channel 8 communicates with a common liquid chamber 17 formed by the frame 70 via a channel (supply port) 9 of the vibration plate 3 and an opening 151 serving as a channel of the subframe 150.

The vibration plate 3 forms a deformable vibration region 130 that constitutes a part of the wall surface of the individual liquid chamber 6. On the surface of the vibration plate 3 opposite to the individual liquid chamber 6, the piezoelectric element 18 is provided integrally with the vibration region 130. The vibration region 130 and the piezoelectric element 18 constitute a piezoelectric actuator.

The piezoelectric element 18 includes, from the vibration region 130 side, a first electrode 13, a piezoelectric body 12, and a second electrode 14 that are laminated in a sequential manner. An insulating film 26 is formed on the actuator substrate 120.

The first electrode 13 serving as a common electrode for the plurality of piezoelectric elements 18 is connected to a common electrode power supply wiring pattern 121 via a common wiring 15. As illustrated in FIG. 4, the first electrode 13 is a single electrode layer formed across all the piezoelectric elements 18 in the nozzle array direction.

The second electrode 14 serving as an individual electrode of each piezoelectric element 18 is connected to a driver IC 500 serving as a drive circuit via an individual wiring 16.

The individual wiring 16 is one of a plurality of individual wirings connected to one of the piezoelectric elements and is formed of the metal wiring layer. On the metal wiring layer, an insulating film 27 is formed. The metal wiring layer is described in detail later.

The driver IC 500 is mounted on the actuator substrate 120 by a method such as flip chip bonding so as to cover regions between the piezoelectric element arrays.

The driver IC 500 mounted on the actuator substrate 120 is connected to an individual electrode power supply wiring pattern 103 to which a driving waveform (driving signal) is supplied.

A wiring provided to the wiring member 160 is electrically connected to the driver IC 500. The other end of the wiring member 160 is connected to a controller disposed in the apparatus main body.

On the actuator substrate 120, as described above, the subframe 150 is provided. The subframe 150 has the opening 151 serving as a channel communicating the common liquid chamber 17 with the individual liquid chamber 6, a recess 152 housing the piezoelectric element 18, and an opening 153 housing the driver IC 500.

The subframe 150 is bonded to the vibration plate 3 side surface of the actuator substrate 120 with an adhesive.

The frame 70 forms the common liquid chamber 17 that supplies liquid to each individual liquid chamber 6. The common liquid chamber 17 is provided for each of the four nozzle arrays. To the common liquid chamber 17, a liquid of a desired color is supplied via a liquid supply port 71 from the outside.

To the frame 70, a damper assembly 90 is bonded. The damper assembly 90 includes a modifiable damper 91 that forms a part of the wall surface of the common liquid chamber 17, and a damper plate 92 that reinforces the damper 91.

The frame 70 is bonded to the outer peripheral portion of the nozzle plate 1 to accommodate the actuator substrate 120 and the subframe 150, thus constituting the frame of this head.

Further, a nozzle cover 45 is provided to cover the peripheral edge of the nozzle plate 1 and a part of the outer circumferential surface of the frame 70.

In this liquid discharge head, the driver IC 500 applies a voltage to between the second electrode 14 and the first electrode 13 of the piezoelectric element 18 to cause the piezoelectric body 12 to expand in the direction of lamination of electrodes, that is, the electrolytic direction, and to contract in the direction parallel to the vibration region 130.

At this time, because the first electrode 13 side is restricted by the vibration region 130, a tensile stress is generated on the first electrode 13 side of the vibration region 130. The vibration region 130 thereby warps toward the individual liquid chamber 6 and pressurizes a liquid therein, making the liquid being discharged from the nozzle 4.

Next, embodiments of the metal wiring layer included in the piezoelectric element substrate are described below.

First Embodiment

Figure 5:
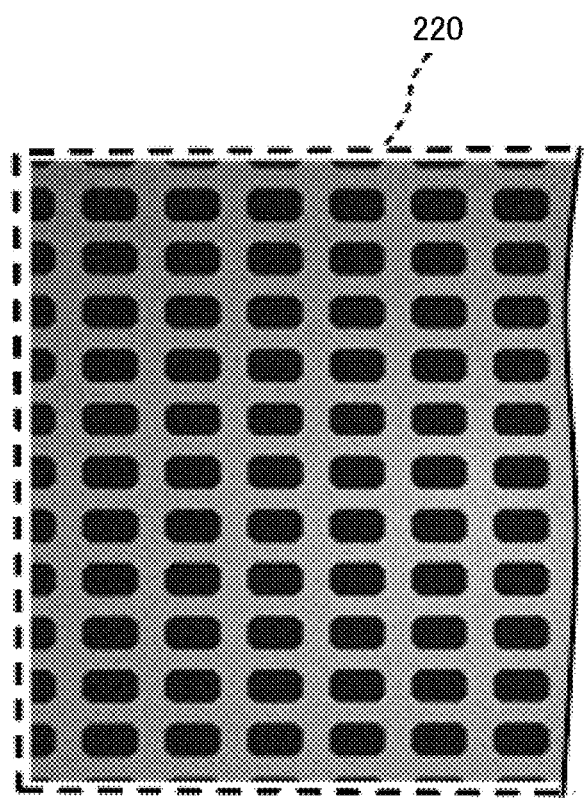
FIG. 5 is a diagram illustrating a bonding pattern provided in a region different from a wiring pattern on a metal wiring layer provided in an actuator substrate according to an embodiment of the present invention.

A first embodiment is described below with reference to FIGS. 5 to 9. FIG. 5 is a diagram illustrating a bonding pattern provided in a region different from a wiring pattern on a metal wiring layer provided on an actuator substrate according to an embodiment of the present invention.

The wiring pattern is the individual wiring 16 corresponding to the second electrode 14 as an individual electrode of the piezoelectric element 18. The wiring pattern is formed for each of the plurality of piezoelectric elements 18 included in the actuator substrate.

The bonding pattern is formed around the wiring pattern, specifically in a bonding region 220 to be bonded to the subframe 150 serving as another substrate. The bonding pattern has a plurality of slots.

The bonding region 220 (also referred to as "bonding portion") is a relatively large region on a metal wiring layer 200 to be bonded to the subframe 150, on which the bonding pattern is provided.

The bonding region 220 is a region where the metal wiring layer 200 and the subframe 150 are bonded to each other, having a size that causes the above-described problems when formed of a solid film. The bonding region 220 is larger in area than wall portions (projected portions) formed of the metal wiring layer 200 present between the piezoelectric elements.

The bonding region 220 is preferably provided in a region along the outer periphery of the piezoelectric element substrate.

In the liquid discharge head according to the present embodiment, the subframe 150 is provided with a plurality of recesses 152 for accommodating the piezoelectric elements. Each recess 152 is disposed above the region where the corresponding piezoelectric element is disposed. Since the bonding region 220 is a region to be bonded to the subframe 150, the bonding region 220 is not provided in a region facing the recess 152.

The bonding region between the metal wiring layer 200 and the subframe 150 has two regions: a region where the subframe 150 is directly bonded to the metal wiring layer 200; and a region where the subframe 150 is bonded to the insulating film 26 formed below the metal wiring layer 200.

Figure 6:
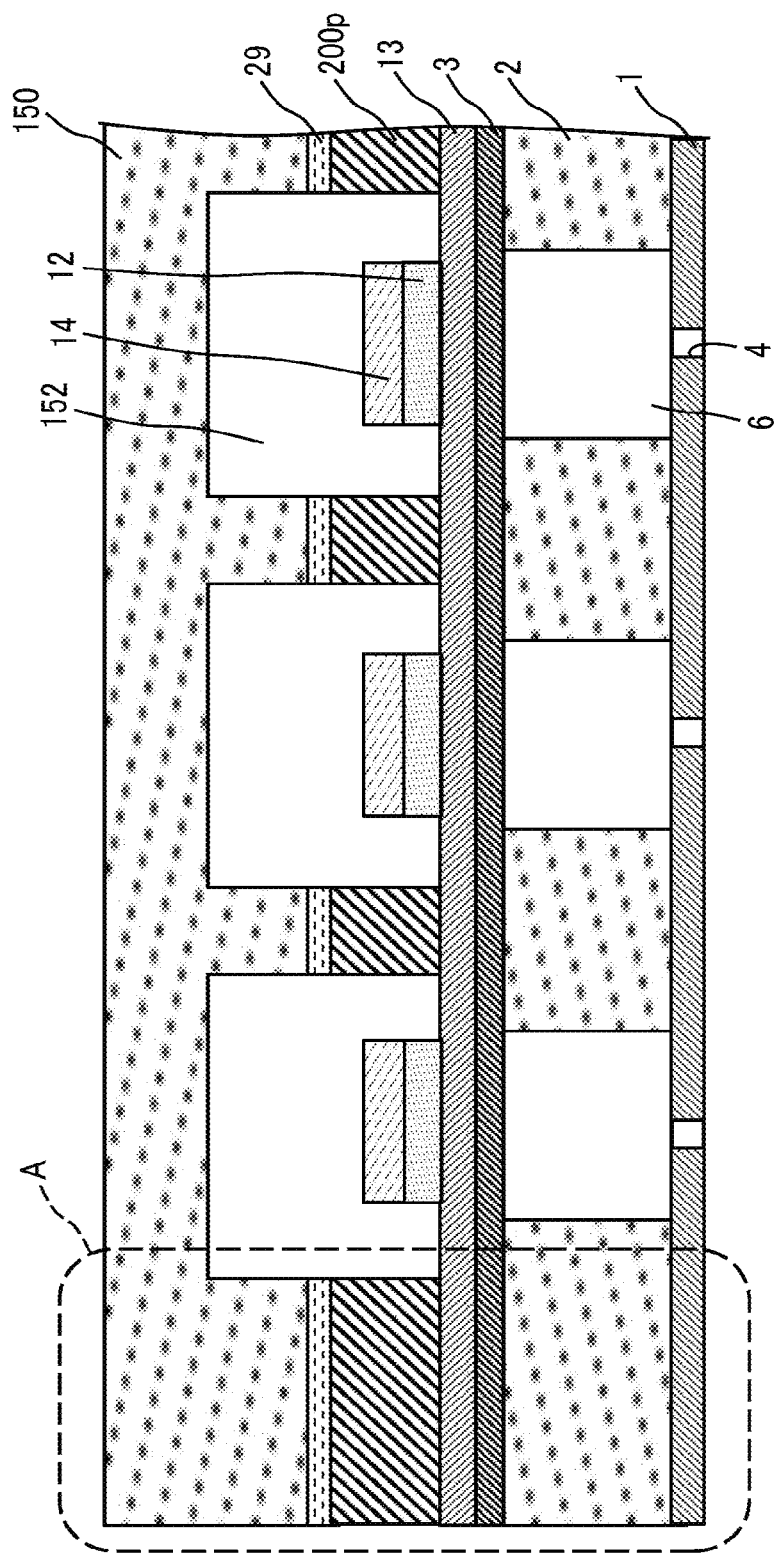
FIG. 6 is a partial cross-sectional view of the liquid discharge head in the nozzle array direction, illustrating a bonding region between a metal wiring layer and a subframe.

FIG. 6 is a partial cross-sectional view of the liquid discharge head in the nozzle array direction, illustrating a large bonding region between the metal wiring layer and the subframe. In FIG. 6, a bonding pattern of a conventional metal wiring layer 200p is illustrated. The left side of FIG. 6 coincides with one end of the actuator substrate 120 in the nozzle array direction.

The metal wiring layer 200p and the subframe 150 are bonded to each other with an adhesive 29. Projected wall portions formed of the metal wiring layer 200p are provided between the adjacent piezoelectric elements 18, and bonded to the subframe 150 with the adhesive 29 at between the piezoelectric elements 18.

The bonding region 220 may be provided in a portion indicated by symbol A surrounded by a dotted line.

In the outer peripheral portion of the actuator substrate 120 bonded to the subframe 150, the metal wiring layer is given a larger area than the wall portions present between the piezoelectric elements. Therefore, to prevent the actuator substrate from warping from the outer peripheral portion, the bonding region bonded to the subframe 150 is preferably made stronger.

Figure 7:
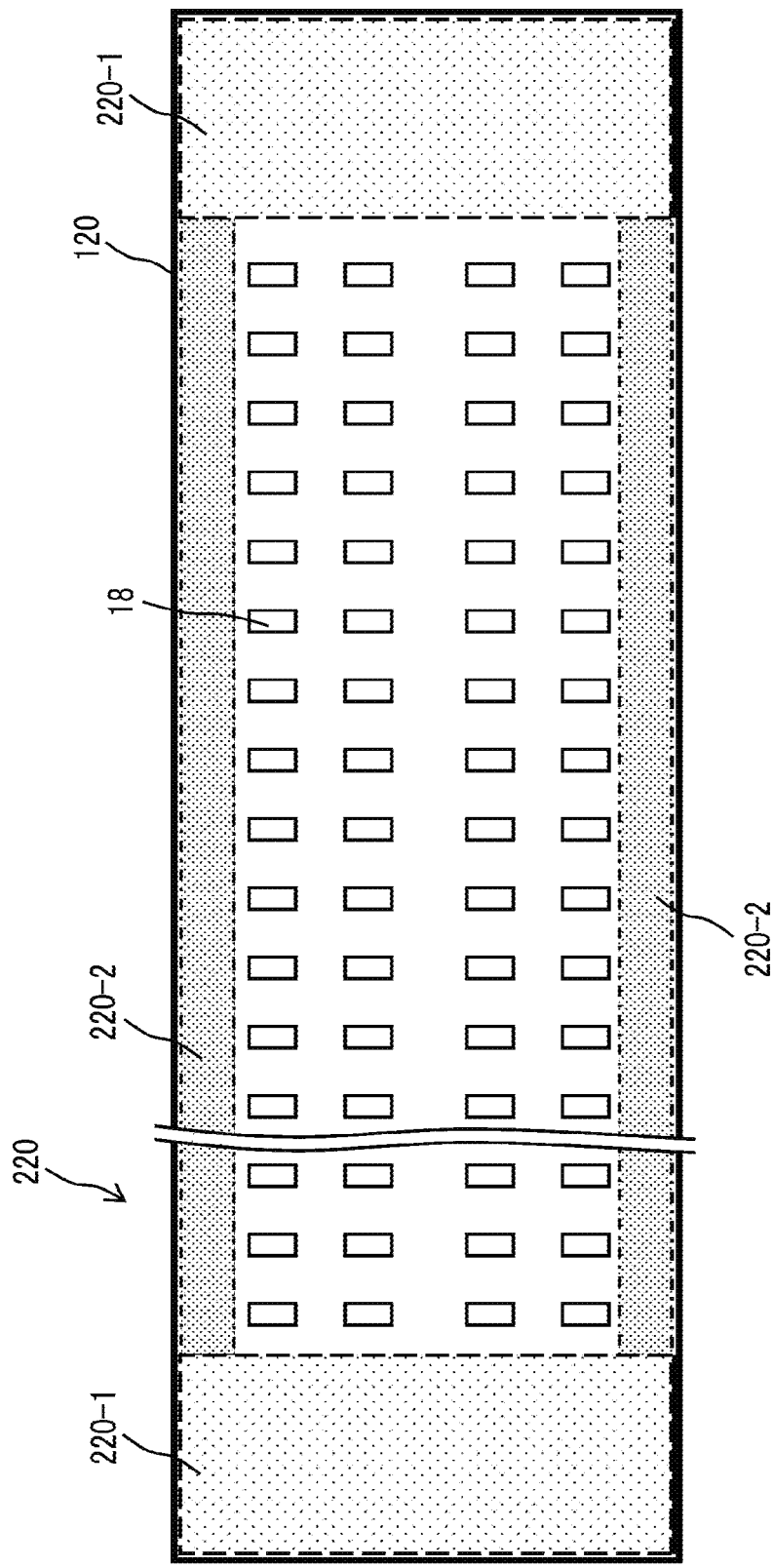
FIG. 7 is a schematic diagram illustrating an arrangement example of the bonding region.

FIG. 7 is a schematic diagram illustrating an arrangement example of the bonding region 220 including bonding regions 220-1 and 220-2. Specifically, FIG. 7 is a top view of the actuator substrate 120 having four arrays of the piezoelectric elements 18 corresponding to the nozzle arrays. The bonding region 220 is preferably provided along the outer periphery of the actuator substrate 120. The bonding region 220 may include a bonding region 220-1 disposed along the direction orthogonal to the nozzle array direction and/or a bonding region 220-2 disposed along the nozzle array direction. The bonding region 220 may be provided in other parts of the region different from the wiring region in FIG. 7, for example, in between the plurality of piezoelectric element arrays.

The portion indicated by symbol A in FIG. 6 corresponds to the bonding region 220-1.

Figure 8:
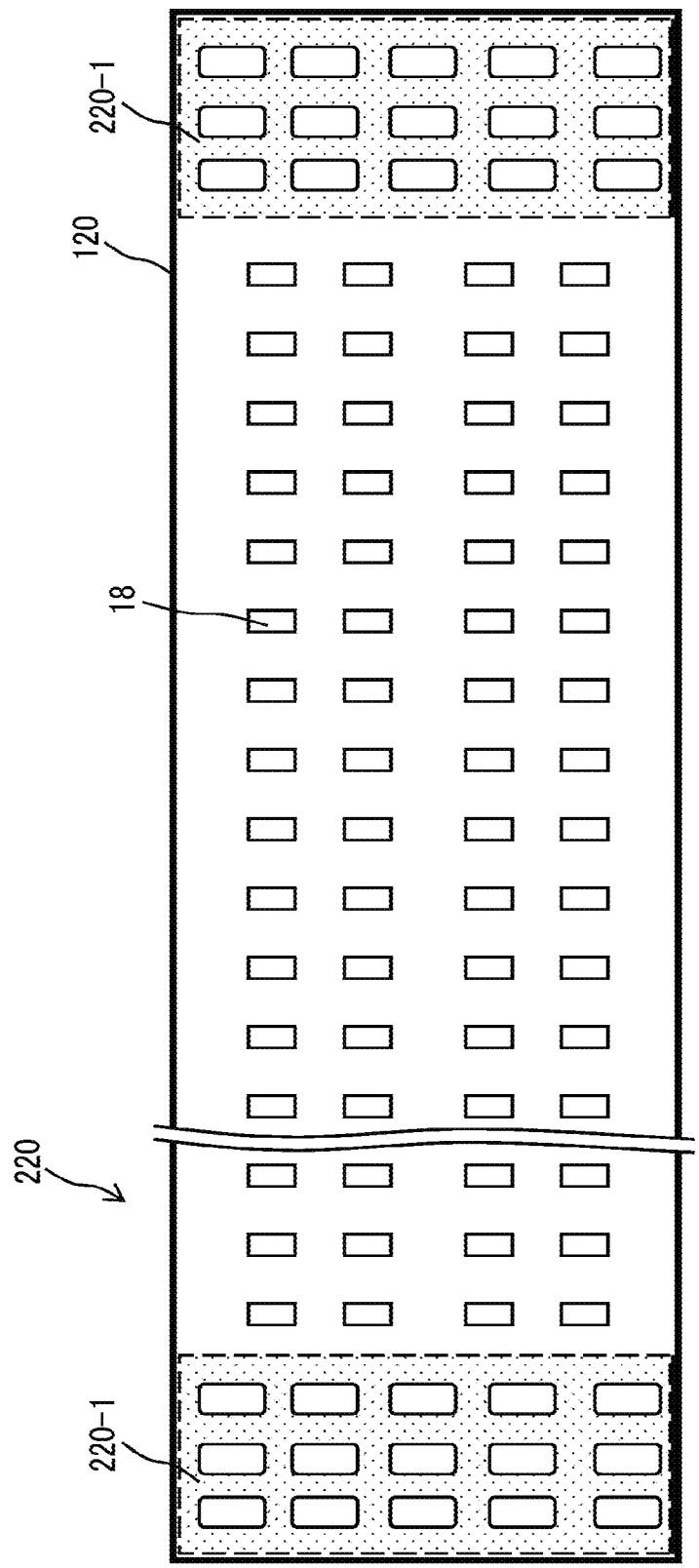
FIG. 8 is a schematic diagram illustrating a bonding pattern provided in the bonding region according to an embodiment of the present invention.

FIG. 8 is a schematic diagram illustrating an arrangement example in which a bonding pattern is provided in the bonding region 220-1 illustrated in FIG. 7. In FIG. 8, the wiring pattern is omitted. In FIG. 8, the bonding pattern is only schematically illustrated, and the bonding pattern illustrated in FIG. 5 may be provided in the bonding region.

Figure 9:
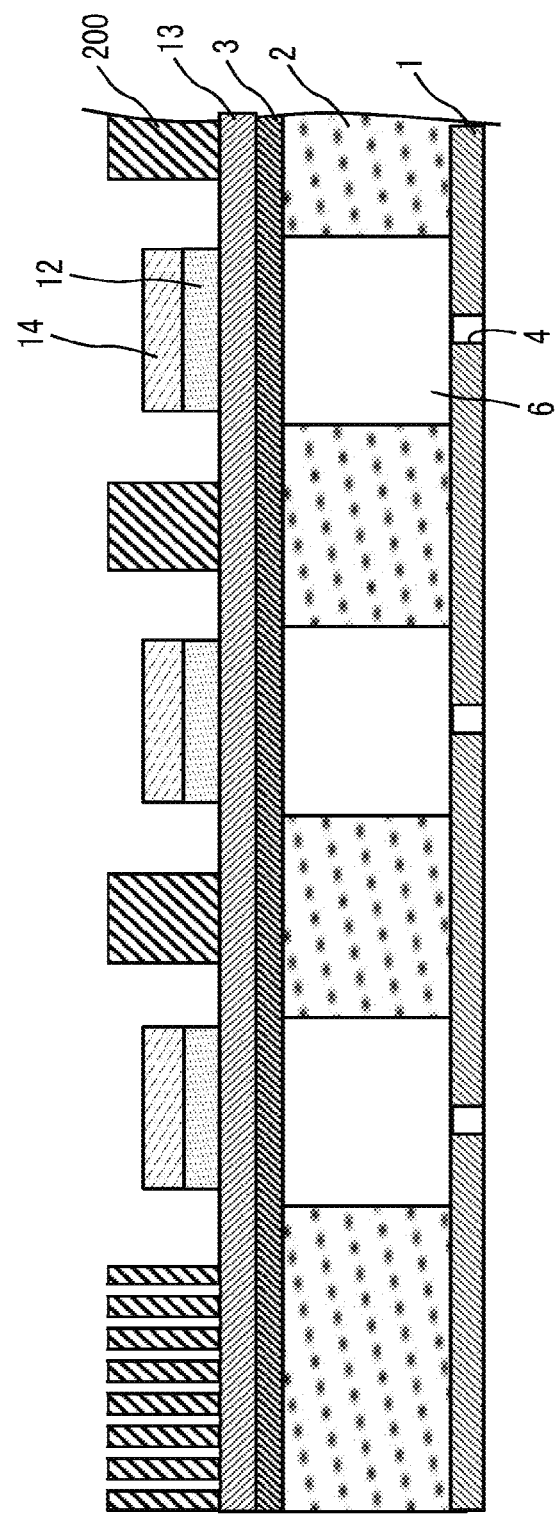
FIG. 9 is a partial cross-sectional view of the bonding pattern provided in the bonding region according to an embodiment of the present invention.

FIG. 9 is a partial cross-sectional diagram illustrating the bonding pattern of the bonding region according to the present embodiment. FIG. 9 illustrates the same portion of the actuator substrate as FIG. 6 before being bonded to the subframe 150 with the adhesive 29. Note that, in FIG. 9, the bonding pattern is schematically illustrated to have a plurality of slots. The size, number, and position of the slots are not consistent with those of the bonding pattern illustrated in FIG. 5 or FIG. 8.

FIG. 5 illustrates a non-limiting example of the bonding pattern having a plurality of slots formed in the bonding region 220, in which the slots having an identical shape are regularly arranged. The bonding region 220 is at least not formed of a solid film and is preferably provided with a plurality of slots having an arbitrary shape. The slots may be different from each other in size and/or shape. Alternatively, the slots in the same row or line may be different in shape and/or size from those in another row or line. Further, in the bonding pattern in the bonding region 220, the proportion of the metal layer (where no slot is formed) and the proportion of the slots (where the insulating film 26 is exposed) may be either the same or different.

Preferred shapes and arrangements of the plurality of slots are described later in the second embodiment.

The effect of the present embodiment is as follows.

In the liquid discharge head, as described above, the metal wiring layer 200 and the subframe 150 are bonded to each other via the adhesive 29 on the vibration plate side of the actuator substrate 120. Prior to this bonding, the upper surface of the metal wiring layer 200 of the actuator substrate 120 is subjected to organic peeling cleaning using, for example, an amine solvent.

At this time, when the bonding region provided in a region different from the wiring pattern is formed of a solid film with no particular pattern, the surface of the solid film gets partially eroded during the cleaning of the metal wiring layer. Therefore, crater-like defects (recesses) have been conventionally generated on the surface of the bonding region to cause the above-described problems.

On the other hand, in the present embodiment, the bonding pattern having a plurality of slots is formed in the bonding region 220 provided in a region different from the wiring pattern on the metal wiring layer 200 on the actuator substrate. In addition, the bonding area in the bonding region 220 has been reduced. Therefore, crater-like defects are not generated during the organic peeling cleaning of the upper surface of the metal wiring layer 200. Furthermore, the height of the bonding surface to the subframe 150 is secured, and the film stress in the bonding region on the upper surface of the metal wiring layer 200 is relaxed. Further, since the surface roughness due to the unevenness of the surface of the bonding region 220 is not increased, the bonding strength between the subframe 150 and the metal wiring layer 200 is increased.

According to the present embodiment, the above-described problems have been solved by reducing the area of the metal wiring layer 200 in the bonding region to prevent generation of recesses. As a result, the occurrence of film peeling is prevented when the actuator substrate is driven. Further, the yield of the actuator substrate is secured at the time of bonding the subframe.

Second Embodiment

Next, a second embodiment of the present invention is described in detail below. In the present embodiment, in the bonding region 220 on the actuator substrate 120, a bonding pattern in which a plurality of slots having an identical shape are regularly arranged is formed on the metal wiring layer 200.

Preferably, in the bonding pattern formed in the bonding region, the slots have an identical shape and are regularly arranged. Further, it is preferable that the plurality of slots in the bonding pattern be arranged in a grid shape.

Further, it is preferable that the proportion of area of the metal wiring layer (where no slot is formed) and the proportion of area of the slots be equal.

With such a configuration, the actuator substrate benefits the effect of the above-described first embodiment. In addition, since the area of the metal wiring layer (where no slot is formed) and the area of the plurality slots are equally provided in the bonding pattern, the film stress on the metal wiring layer is equalized on the bonding region at the time of bonding to the subframe 150. Therefore, the bonding strength between the subframe 150 and the metal wiring layer is further increased.

Third Embodiment

Next, a third embodiment of the present invention is described in detail below. In each of the above-described embodiments, preferably, the bonding pattern provided in the bonding region 220, which is different from the wiring pattern, on the metal wiring layer 200 on the actuator substrate 120 has the same shape as a void pattern of the subframe 150.

More preferably, the bonding pattern provided in the bonding region 220, which is different from the wiring pattern, on the metal wiring layer 200 on the actuator substrate 120 has the same shape as the void pattern of the subframe 150, and further the position of the bonding pattern and the position of the void pattern of the subframe 150 are aligned at the time of bonding.

Figure 10A:
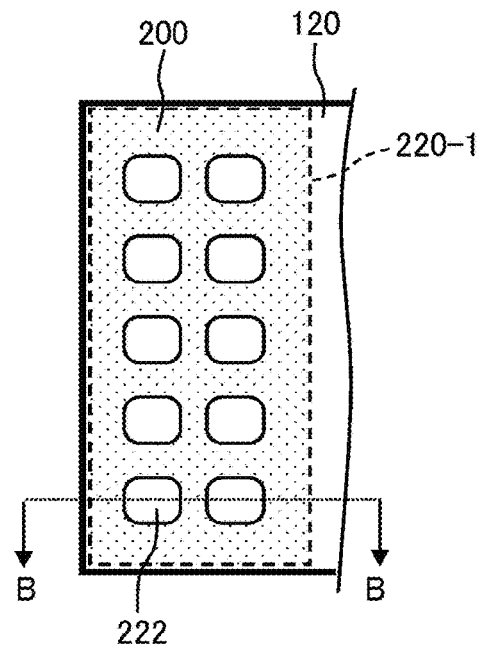
FIGS. 10A and 10B are schematic diagrams illustrating a bonding surface of a metal wiring layer and a subframe, respectively, according to the third embodiment.
Figure 10B:
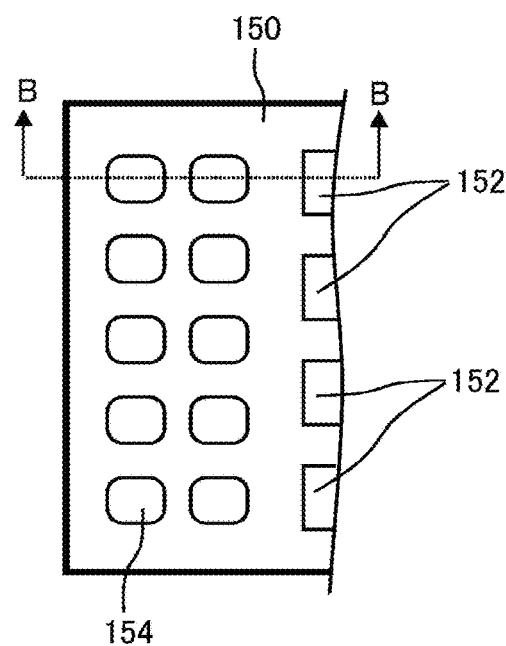

FIGS. 10A and 10B are schematic diagrams illustrating a bonding surface of the metal wiring layer and the subframe, respectively. In FIG. 10A, the bonding region 220-1 in FIG. 7 is illustrated as an example. FIG. 10A is a diagram illustrating the metal wiring layer 200 formed in the bonding region 220-1 provided on the actuator substrate 120. FIG. 10B is a diagram illustrating a bonding surface of the subframe 150.

The subframe 150 has a plurality of voids 154 formed on the bonding surface. The metal wiring layer 200 has a bonding pattern having a plurality of slots 222. In FIG. 10A, two slots 222 are provided in each of five rows. In FIG. 10B, two voids 154 are provided in each of five rows.

As described above, it is preferable that the slots 222 have the same size as the voids 154 provided on the subframe 150. In addition, it is preferable that the positions of the voids 154 and the positions of the slots 222 be aligned.

In the example illustrated in FIGS. 10A and 10B, the metal wiring layer 200 of the actuator substrate 120 and the subframe 150 are bonded to each other so that the portions along the line B-B face each other.

Figure 11:
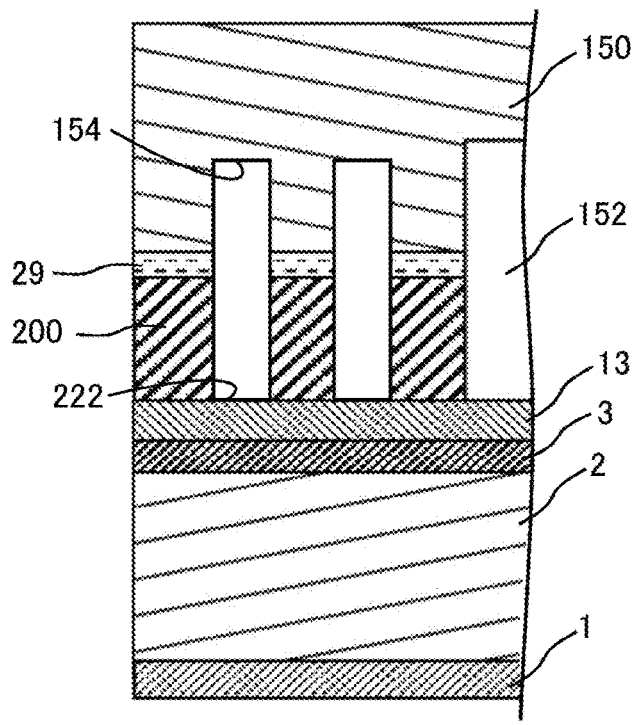
FIG. 11 is a partial cross-sectional view of the bonding surface between the metal wiring layer and the subframe, taken along a line B-B in FIG. 10A.

FIG. 11 is a partial cross-sectional view of the bonding surface between the metal wiring layer and the subframe, taken along the line B-B in FIGS. 10A and 10B. FIG. 11 corresponds to the portion A surrounded by a dotted line in FIG. 6.

As the sizes are identical and the positions are aligned, each of the voids 154 and the corresponding slot 222 form one continuous space.

Figure 12:
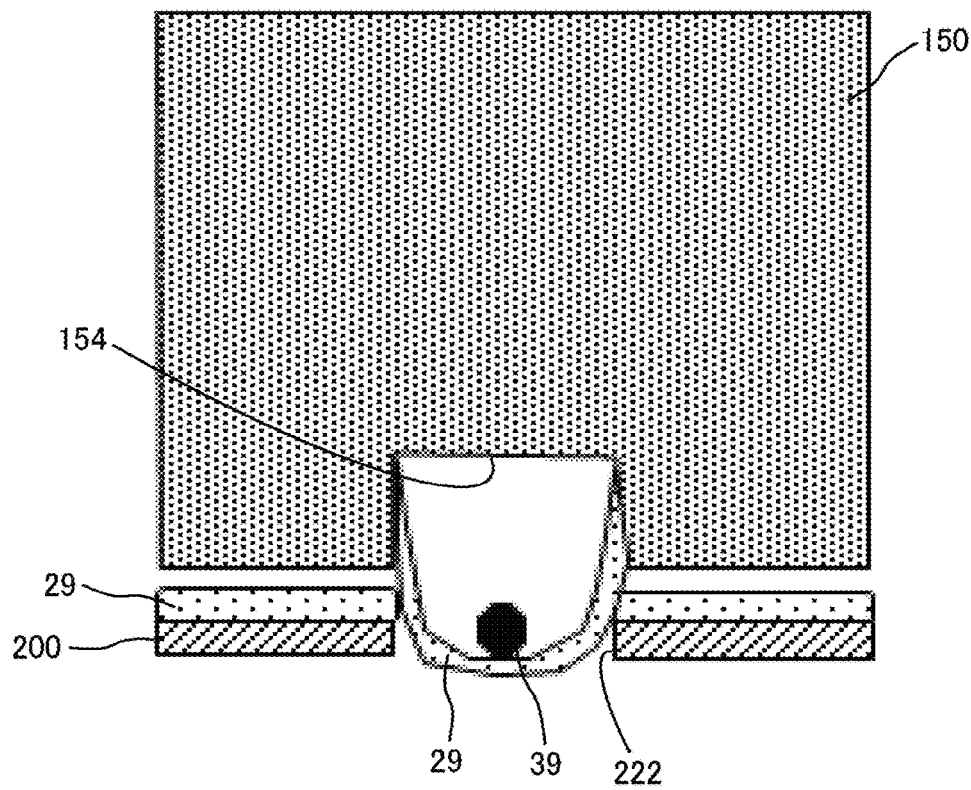
FIG. 12 is a diagram illustrating a cross-section of the bonding region between the subframe and the metal wiring layer according to an embodiment of the present invention.
Figure 13:
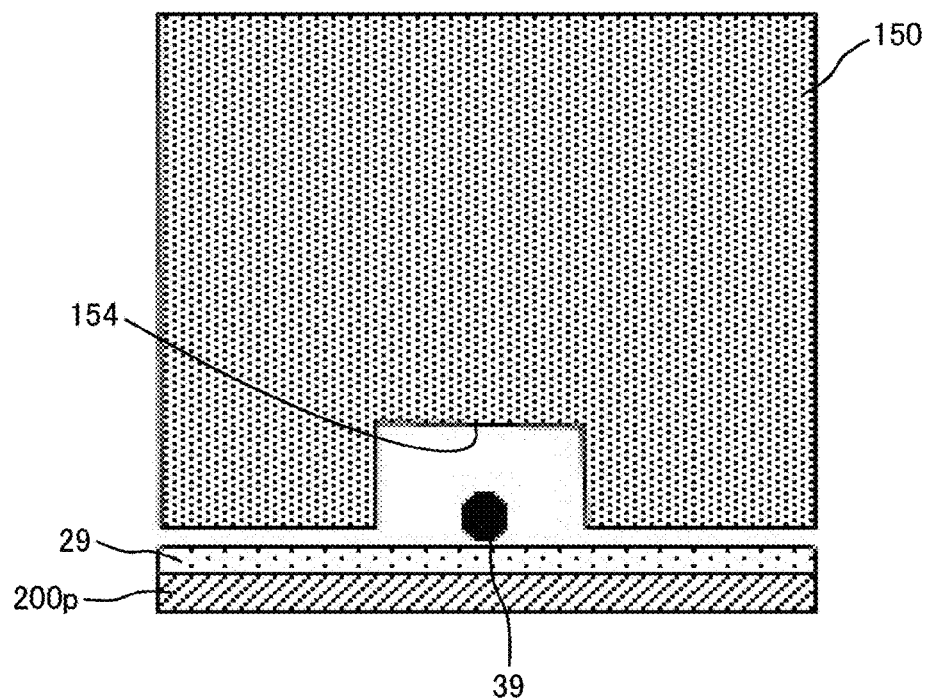
FIG. 13 is a diagram illustrating a cross-section of the bonding region between the subframe and the metal wiring layer according to related art.

Next, foreign matter present in the bonding region between the metal wiring layer 200 and the subframe 150 is described below. FIG. 12 is a diagram illustrating a cross-section of the bonding region between the subframe and the metal wiring layer according to an embodiment of the present invention. FIG. 13 is a diagram illustrating a cross-section of the bonding region between the subframe and the metal wiring layer according to related art.

When foreign matter 39 is present on a solid film formed on the bonding region of the conventional metal wiring layer 200p, as illustrated in FIG. 13, the foreign matter 39 is caught and trapped in the void 154 of the subframe 150 with the adhesive 29 at the time of bonding the subframe 150 to the solid film with the adhesive 29. As a result, in the manufacturing process, the yield of the actuator substrate is reduced.

By contrast, when the bonding pattern having a plurality of slots is formed on the metal wiring layer 200 as in the present embodiment, the actuator substrate benefits the effects of the first and second embodiments. At the time of bonding the actuator substrate 120 and the subframe 150, the slots 222 formed in the bonding region of the metal wiring layer 200 and the voids 154 of the subframe 150 are aligned with each other. Therefore, at the time of bonding the metal wiring layer 200 and the subframe 150, a space is formed without filling the void 154 of the subframe 150 with the adhesive. Even when the foreign matter 39 is present at the bonding region between the metal wiring layer 200 and the subframe 150, the foreign matter 39 moves to the void of the subframe 150, that is, to the open area, due to the capillary phenomenon of the adhesive 29. As a result, the foreign matter 39 is not sandwiched between the metal wiring layer 200 and the subframe 150, as is the case illustrated in FIG. 13. Therefore, in the manufacturing process, the yield of the actuator substrate 120 is secured.

According to the first to fourth embodiments of the present invention, the shape of the pattern formed and arranged in the bonding region of the metal wiring layer to the subframe 150 is not particularly limited. However, to secure the bonding strength in the bonding region and to prevent the entrapment of foreign matter, it is desirable that the pattern include a regular arrangement of rectangles having an identical shape whose corners have a curved shape.

As described above, when the slots of the metal wiring layer and the voids of the subframe have an identical shape and the metal wiring layer and the subframe are bonded to each other with the slots and the voids aligned, a space is formed without filling the void with the adhesive. As a result, foreign matter is not entrapped in between the metal wiring layer and the subframe at the time of bonding, improving the yield of the actuator substrate.

Figure 14B:
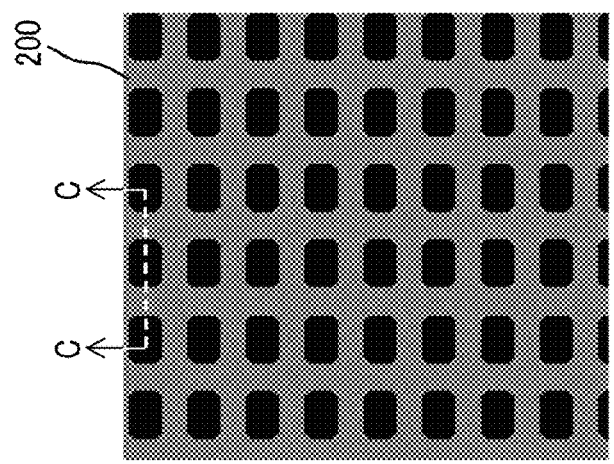
FIGS. 14A and 14B are cross-sectional and plan views, respectively, of the bonding region of the metal wiring layer.
Figure 14A:
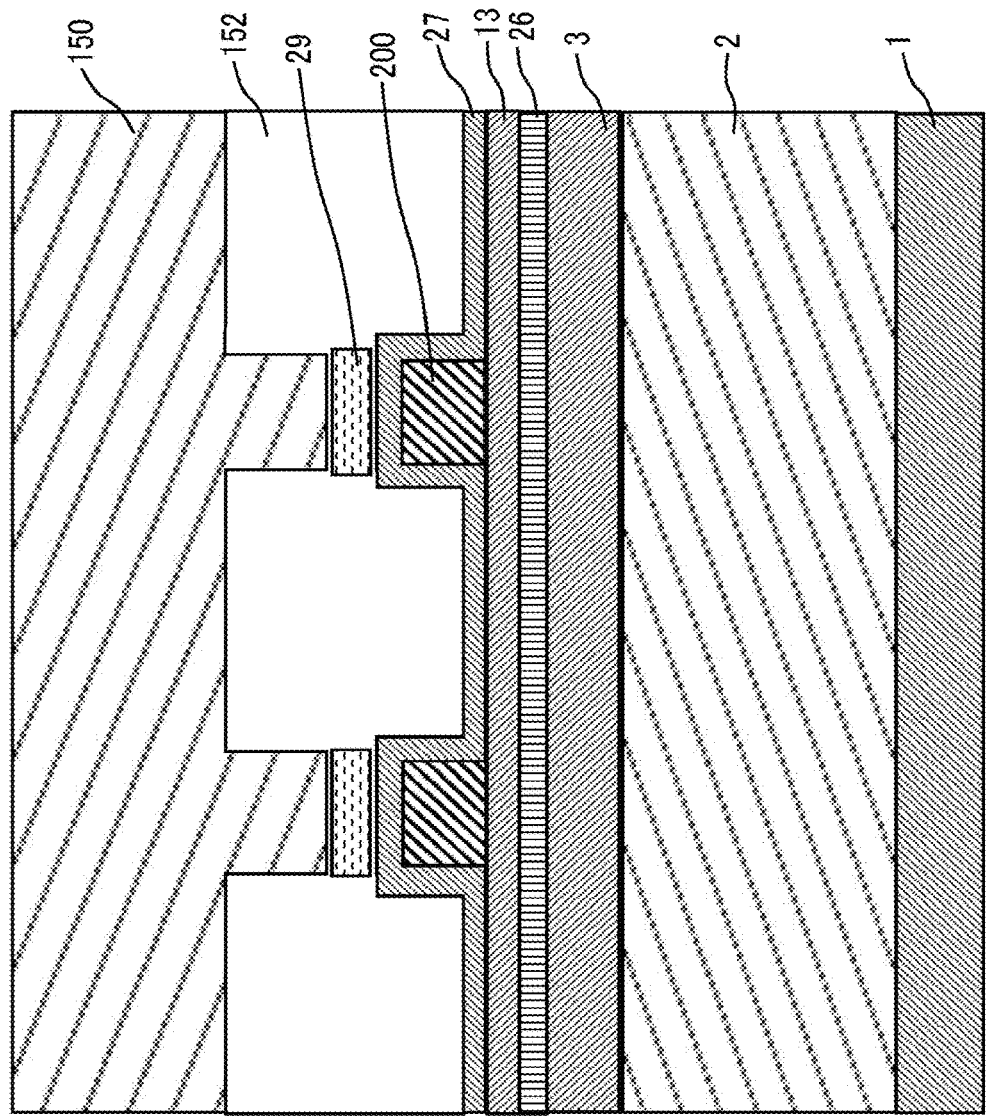

FIGS. 14A and 14B are cross-sectional and plan views, respectively, of the bonding region of the metal wiring layer. FIG. 14A is a partial cross-sectional view of the bonding region between the metal wiring layer 200 and the subframe 150 taken along a line C-C illustrated in FIG. 14B. In FIGS. 6 to 13 referred in the above descriptions, the insulating film is omitted. The insulating film 26 as an interlayer insulating film and the insulating film 27 as a passivation film illustrated in FIGS. 3 and 4 may be laminated as illustrated in FIG. 14A in the bonding region 220 on the metal wiring layer 200.

Fourth Embodiment

Next, a fourth embodiment of the present invention is described in detail below. In the present embodiment, the actuator substrate according to the third embodiment is used for a liquid discharge head, and each of the spaces present between the metal wiring layer 200 and the subframe 150 in the bonding region functions as a liquid supply port. That is, at least one of the plurality of slots in the metal wiring layer 200 and at least one of the plurality of voids in the subframe 150 function as a liquid supply port. In this way, a new function is given to the bonding region between the metal wiring layer 200 and the subframe 150.

Fifth Embodiment

Next, a fifth embodiment of the present invention is described in detail below. The present embodiment relates to a liquid discharge head mounting the actuator substrate according to any of the first to fourth embodiments.

When a liquid discharge head equipped with the actuator substrate 120 having the conventional metal wiring layer 200p is driven, film peeling occurs at the bonding interface between the metal wiring layer 200 and the subframe 150, reducing reliability of the bonding interface.

By contrast, in driving the liquid discharge head according to the present embodiment, film peeling does not occur at the bonding interface between the metal wiring layer 200 of the actuator substrate 120 and the subframe 150, preventing a decrease of the reliability of the bonding.

Sixth Embodiment

A liquid discharge head according to the present embodiment is described in detail below with reference to FIGS. 15 to 22. Embodiments of the present invention provide, in addition to the above-described liquid discharge head described with reference to FIGS. 1 to 4, a liquid discharge head described below with reference to FIGS. 15 to 22. Hereinafter, descriptions of the same items as those in the above embodiments will be appropriately omitted.

Figure 15:
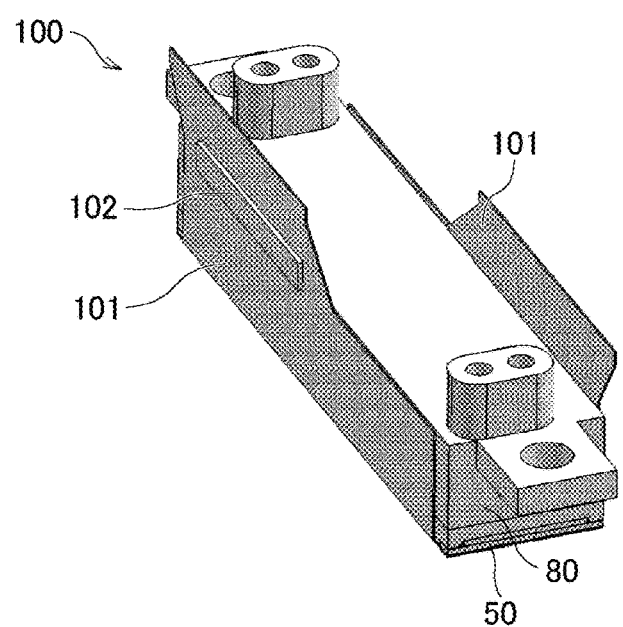
FIG. 15 is an external perspective view of a liquid discharge head according to an embodiment of the present invention.
Figure 16:
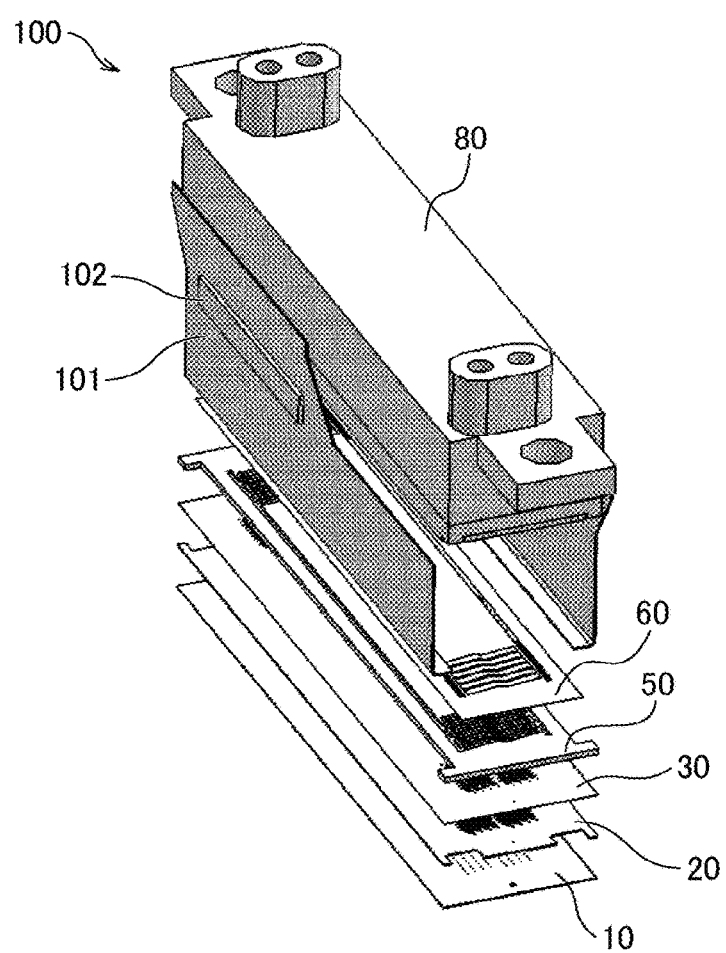
FIG. 16 is an exploded perspective view of the liquid discharged head.
Figure 17:
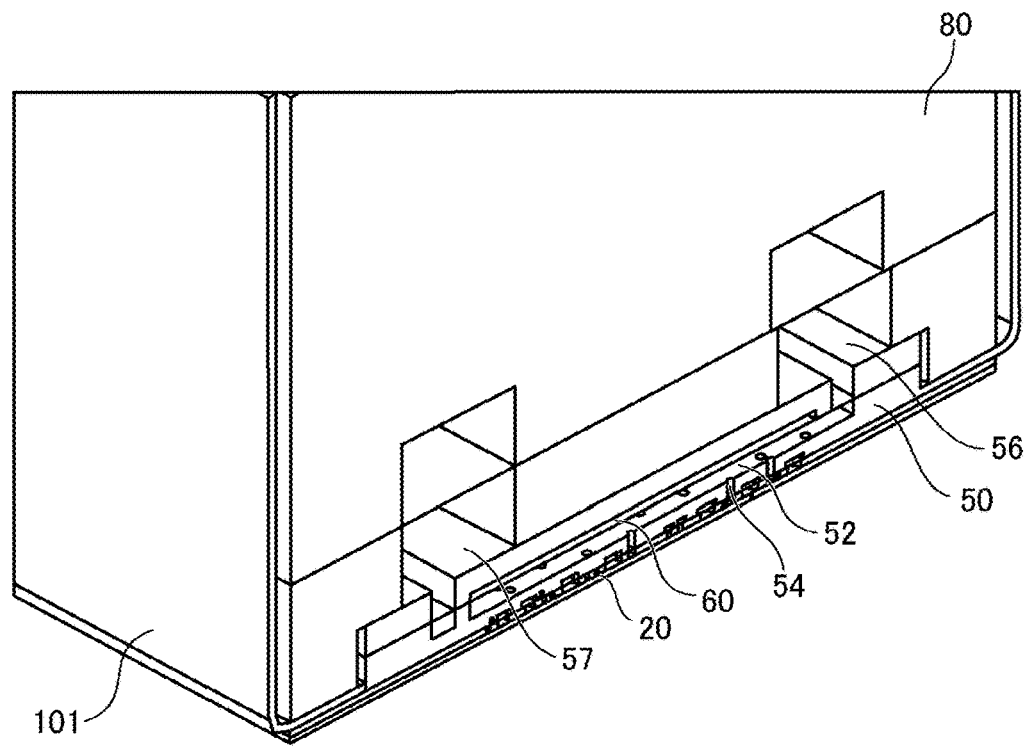
FIG. 17 is a cross-sectional perspective view of the liquid discharge head.
Figure 18:
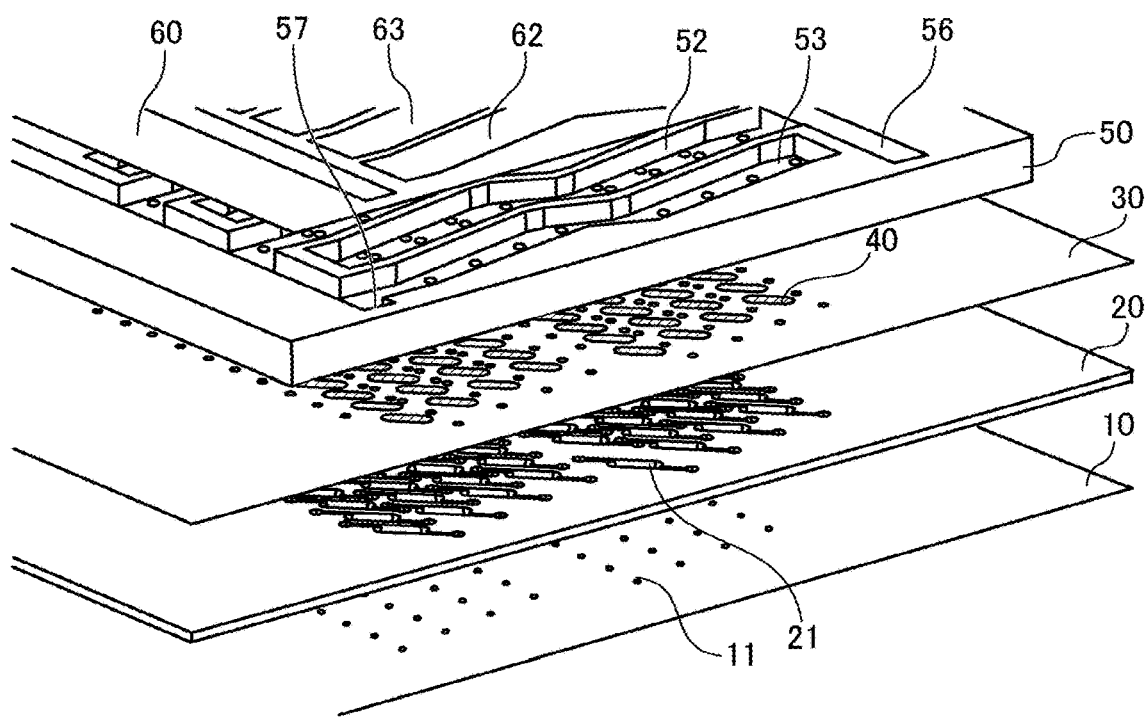
FIG. 18 is an exploded perspective view of the liquid discharged head excluding the frame.
Figure 19:
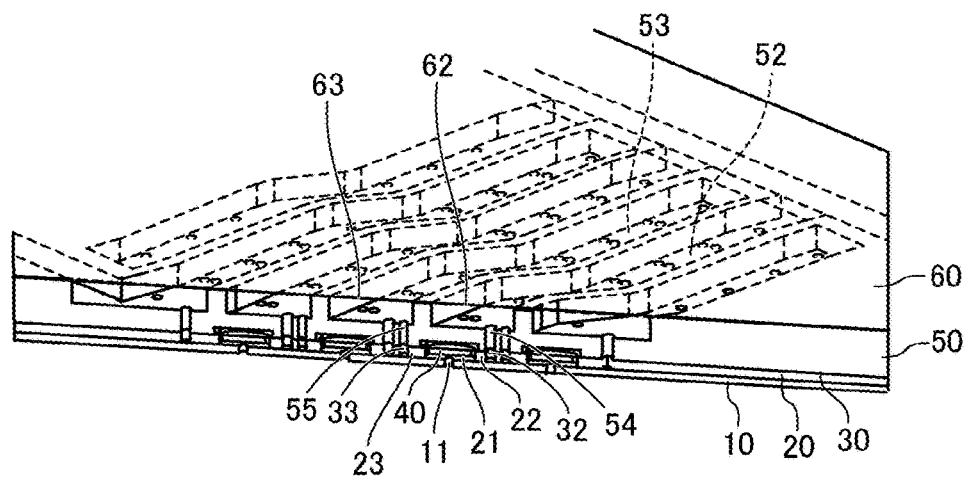
FIG. 19 is a cross-sectional perspective view of channels in the liquid discharge head.
Figure 20:
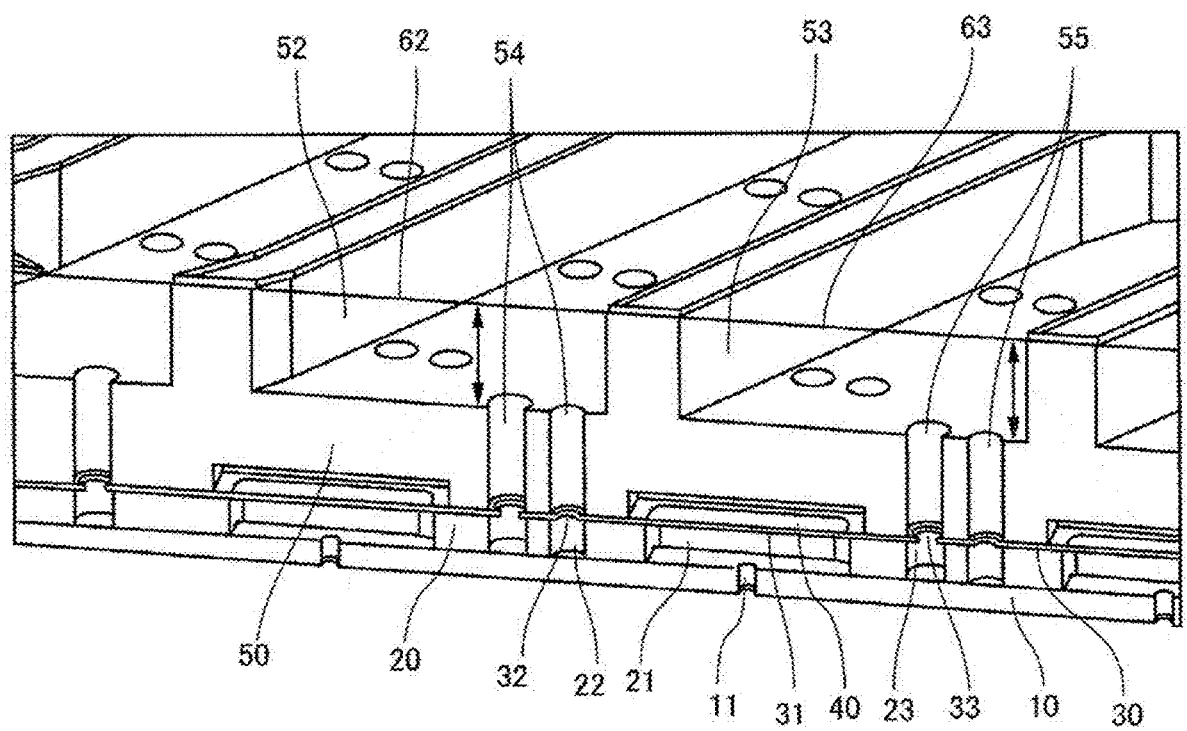
FIG. 20 is an enlarged cross-sectional perspective view of the channels.
Figure 21:
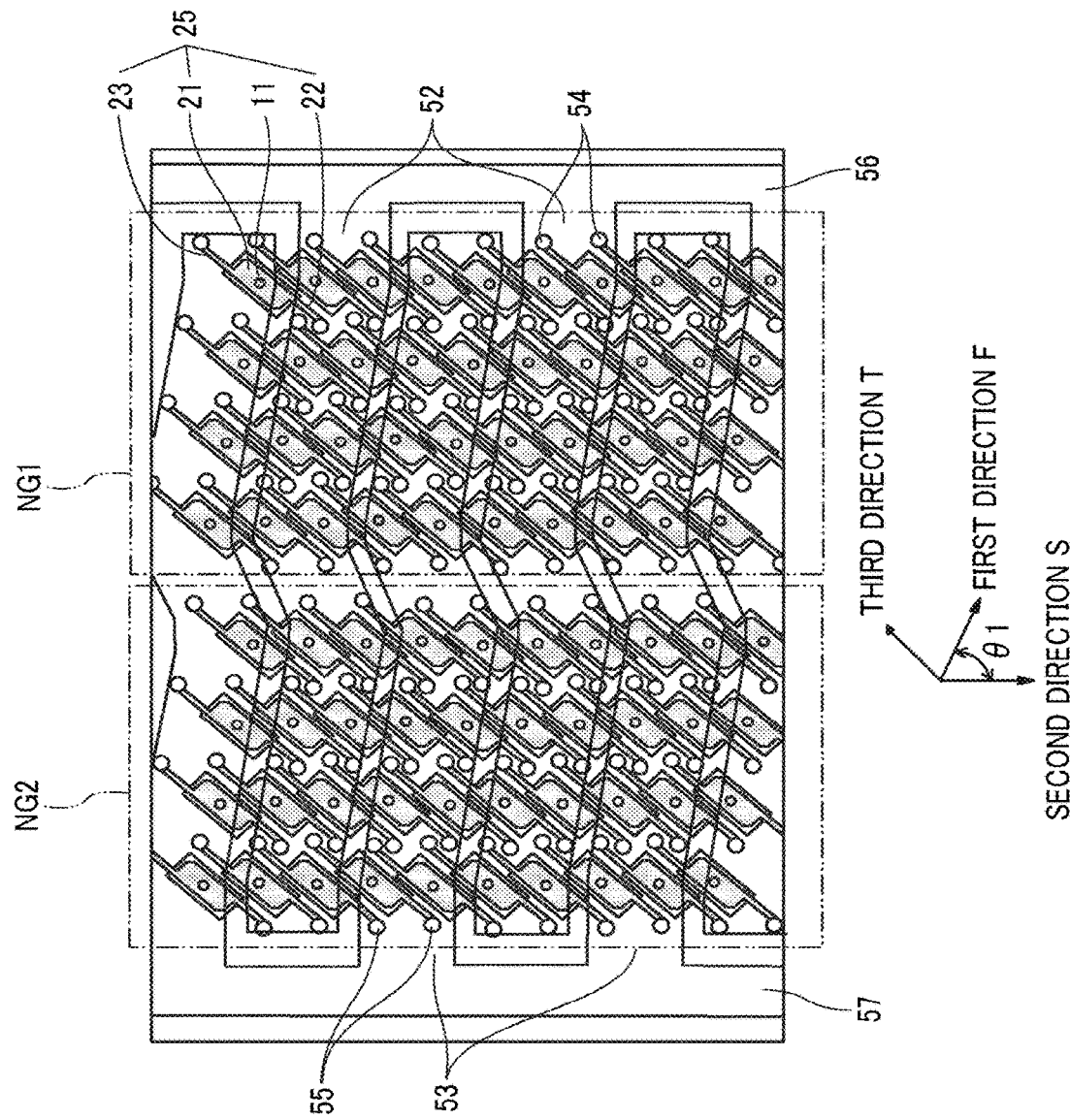
FIG. 21 is a plan view of the channels.
Figure 22:
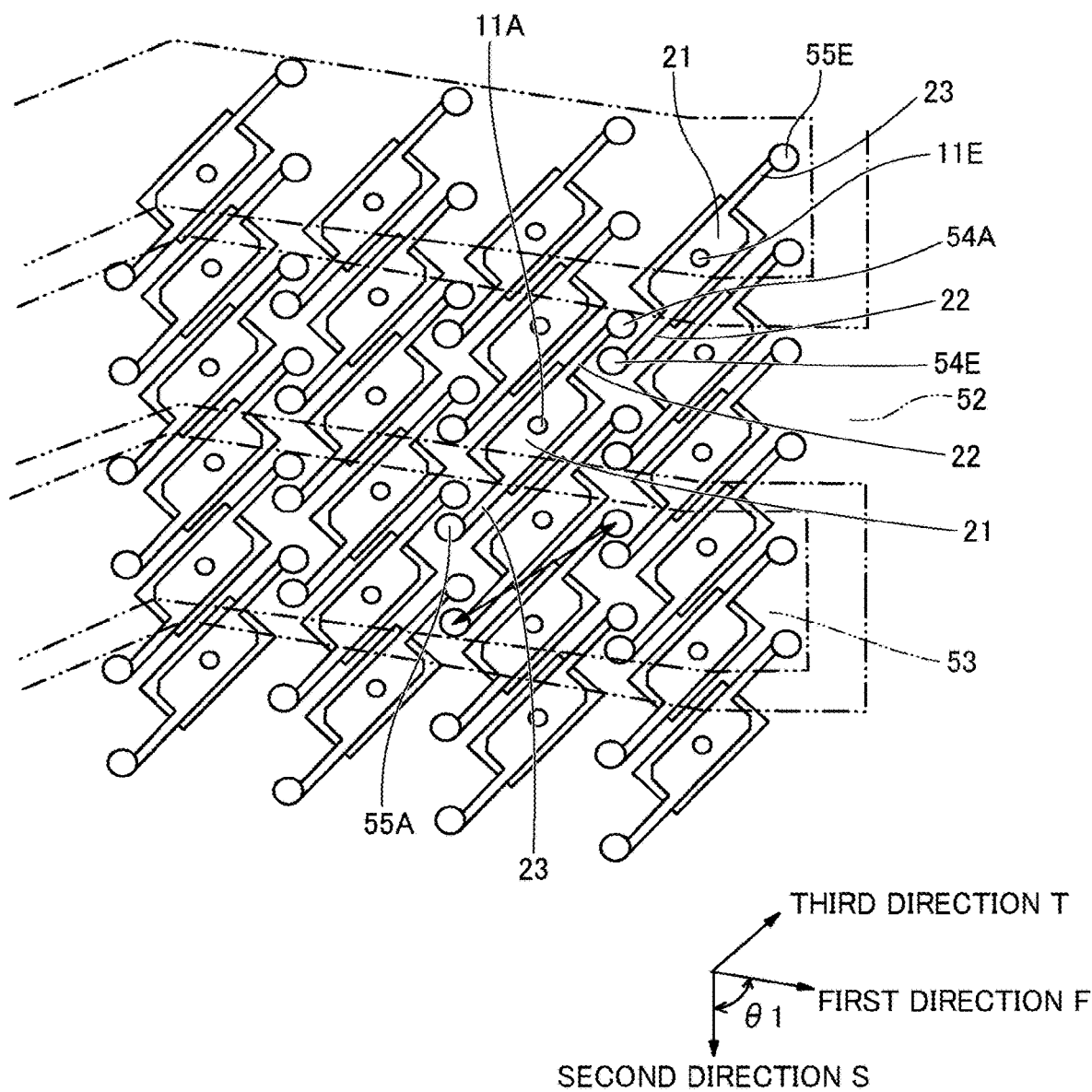
FIG. 22 is a plan view of the channels.

FIG. 15 is a perspective view of a liquid discharge head according to the present embodiment. FIG. 16 is an exploded perspective view of the liquid discharged head. FIG. 17 is a cross-sectional perspective view of the liquid discharge head. FIG. 18 is an exploded perspective view of the liquid discharged head excluding the frame. FIG. 19 is a cross-sectional perspective view of channels in the liquid discharge head. FIG. 20 is an enlarged cross-sectional perspective view of the channels. FIGS. 21 and 22 are plan views of the channels.

A liquid discharge head 100 includes a nozzle plate 10, an individual channel substrate 20, a vibration plate member 30, a common channel substrate 50, a damper 60, a frame 80, and a board (flexible wiring board) 101 on which a drive circuit 102 is mounted.

The nozzle plate 10 has a plurality of nozzles 11 for discharging liquid. The nozzles 11 are arranged in a two-dimensional matrix, specifically arranged side by side in three directions, i.e., a first direction F, a second direction S, and a third direction T, as illustrated in FIGS. 21 and 22.

The individual channel substrate 20 forms a plurality of pressure chambers (individual liquid chambers) 21 that communicate with the plurality of nozzles 11, a plurality of individual supply channels 22 that communicate with the plurality of pressure chambers 21, and a plurality of individual collection channels 23 that communicate with the plurality of the pressure chambers 21. One pressure chamber 21 and one of the individual supply channels 22 and one of the individual collection channels 23 that communicate with this pressure chamber 21 are collectively referred to as an individual channel 25.

The vibration plate member 30 forms a vibration plate 31 that is a deformable wall surface of the pressure chamber 21. The vibration plate 31 is integrally provided with a piezoelectric element 40. Further, the vibration plate member 30 is formed with a supply-side opening 32 that communicates with the individual supply channel 22 and a collection-side opening 33 that communicates with the individual collection channel 23. The piezoelectric element 40 is a pressure generator that causes the vibration plate 31 to deform and pressurize a liquid in the pressure chamber 21.

The individual channel substrate 20 and the vibration plate member 30 are not limited to be separate members. For example, the individual channel substrate 20 and the vibration plate member 30 may be integrally formed as a single member using an SOI (Silicon on Insulator) substrate. That is, an SOI substrate in which a silicon oxide film, a silicon layer, and a silicon oxide film are formed in this order on a silicon substrate can be used, in which the silicon substrate is serving as the individual channel substrate 20 and the silicon oxide film, the silicon layer, and the silicon oxide film are serving as the vibration plate 31. In this configuration, the layer structure of the silicon oxide film, the silicon layer, and the silicon oxide film of the SOI substrate constitutes the vibration plate member 30. Thus, the vibration plate member 30 may be composed of a film formed on the surface of the individual channel substrate 20.

The common channel substrate 50 forms a plurality of common supply channel tributaries 52 that communicates with two or more individual supply channels 22 and a plurality of common collection channel tributaries 53 that communicates with two or more individual collection channels 23, which are adjacent to each other in an alternating manner in the second direction S of the nozzles 11.

The common channel substrate 50 forms a through hole serving as a supply port 54 that communicates the supply-side opening 32 of the individual supply channel 22 with the common supply channel tributary 52, and another through hole serving as a collection port 55 that communicates the collection-side opening 33 of the individual collection channel 23 with the common collection channel tributary 53.

In the present embodiment, the supply-side opening 32 and the collection-side opening 33 are through holes that penetrate a common electrode.

Further, the common channel substrate 50 forms at least one common supply channel mainstream 56 that communicate with the plurality of common supply channel tributaries 52 and at least one common collection channel mainstream 57 that communicate with the plurality of common collection channel tributaries 53.

The damper 60 includes a supply-side damper 62 that faces (opposes) the supply port 54 of the common supply channel tributary 52, and a collection-side damper 63 that faces (opposes) the collection port 55 of the common collection channel tributary 53.

The common supply channel tributary 52 and the common collection channel tributary 53 are formed by sealing grooves arranged alternately in the common channel substrate 50 with the supply-side damper 62 and the collection-side damper 63, respectively, of the damper 60. The damper 60 is preferably made of a metal thin film or inorganic thin film that is resistant to organic solvents. The thickness of the supply-side damper 62 and the collection-side damper 63 of the damper 60 is preferably 10 μm or less.

Referring to FIGS. 21 and 22, the nozzles 11 are arranged in a two-dimensional matrix, specifically arranged side by side in three directions, i.e., a first direction F, a second direction S, and a third direction T. A group of the nozzles 11 arranged in the two-dimensional matrix is referred to as a nozzle group NG (e.g., NG1, NG2) as illustrated in FIG. 21.

In one nozzle group NG, a nozzle array in which the plurality of nozzles 11 is arranged in the first direction F and another nozzle array in which the plurality of nozzles 11 is arranged in the second direction S form an inclination angle θ1 therebetween. The common supply channel tributaries 52 and the common collection channel tributaries 53 extend in the first direction. Therefore, the longitudinal direction of the common supply channel tributaries 52 and the common collection channel tributaries 53 is coincident with the first direction F.

In one nozzle group NG, the second direction S coincides with the direction (nozzle array direction) in which the adjacent nozzles 11 are arranged closest, and intersects the first direction F at an angle θ1. The common supply channel tributaries 52 and the common collection channel tributaries 53 are alternately arranged in the second direction S.

In one nozzle group NG, the third direction T intersects the first direction F and the second direction S. In the present embodiment, the individual channel 25 composed of the individual supply channel 22, the pressure chamber 21, and the individual collection channel 23 is arranged in the third direction.

Here, the individual channel 25 composed of the individual supply channel 22, the pressure chamber 21, and the individual collection channel 23 has a 2-fold axisymmetric shape with respect to the axis of the nozzles 11 (the central axis in the liquid discharge direction).

Referring to FIG. 22, as the individual channel 25 is 2-fold axisymmetric, the individual channels 25 respectively communicating with the nozzles 11A and 11E that are adjacent to each other in the direction parallel to the liquid flow (i.e., third direction T) can be arranged reversely.

More specifically, in the single common supply channel tributary 52, the individual channels 25 respectively communicating with the supply port 54A that communicates with the pressure chamber 21 of the nozzle 11A and the supply port 54E that communicates with the pressure chamber 21 of the nozzle 11E can be arranged reversely with respect to the disposition of the individual liquid chambers.

Accordingly, the mounting density of the pressure chambers 21 (nozzles 11) can be increased and the head can be downsized regardless of by the arrangement of the common supply channel tributaries 52.

In addition, referring to FIG. 22, in the single common supply channel tributary 52, the nozzles 11A and 11E respectively communicating with the most adjacent supply ports 54A and 54E communicate with different common collection channel tributaries 53 through the respective collection ports 55A and 55E.

The individual channel 25 are arranged in translational symmetry (non-reversed arrangement) with respect to the liquid flow direction (i.e., first direction F) in the common supply channel tributary 52 and the common collection channel tributary 53.

Next, the above-described liquid discharge head 100 illustrated in FIGS. 15 to 22 having the metal wiring layer according to some embodiments is described below. In the liquid discharge head 100, the individual channel substrate 20, the vibration plate member 30, and the piezoelectric element 40 disposed on the vibration plate member 30 form an actuator substrate.

FIG. 23 is a diagram schematically illustrating a surface of the vibration plate member 30 of the liquid discharge head according to the present embodiment, which is to be bonded to the subframe.

On the vibration plate member 30, a plurality of piezoelectric elements 40 is formed in a piezoelectric element formation region 46, and a plurality of individual wirings 43 drawn from the plurality of piezoelectric elements 40 is formed around the piezoelectric element formation region 46.

In the present embodiment, the wiring pattern corresponds to the plurality of individual wirings 43 corresponding to the plurality of piezoelectric elements 40. In FIG. 23, the wiring pattern is provided in a region 210 surrounded by a dotted line.

The bonding region 220 is a region provided around the region 210 of the wiring pattern, to be bonded to the common channel substrate 50.

In the bonding region 220, it is preferable that the bonding pattern having a plurality of slots illustrated in FIG. 5 be formed on the metal wiring layer 200.

Seventh Embodiment

In the third embodiment, one example of the bonding pattern provided in the bonding region 220 and the void pattern provided in the subframe 150 has been described.

In the present embodiment, a preferred ratio between the slots of the bonding pattern and the voids of the void pattern is described.

Figure 24B:
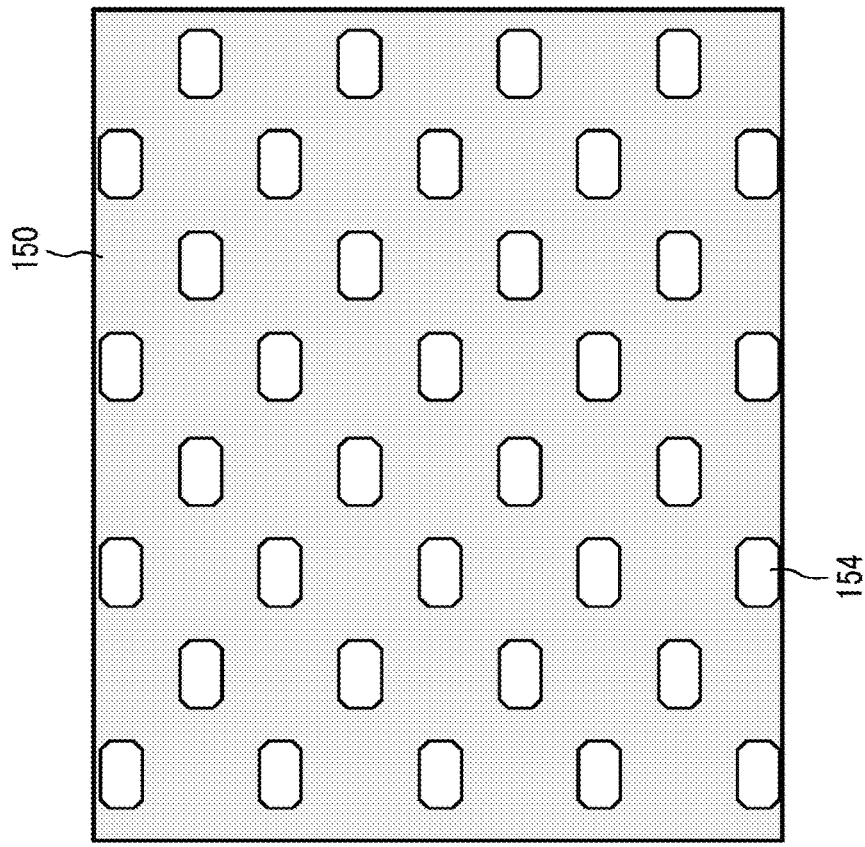
FIGS. 24A and 24B are diagrams illustrating a bonding pattern and a void pattern, respectively, according to the seventh embodiment.
Figure 24A:
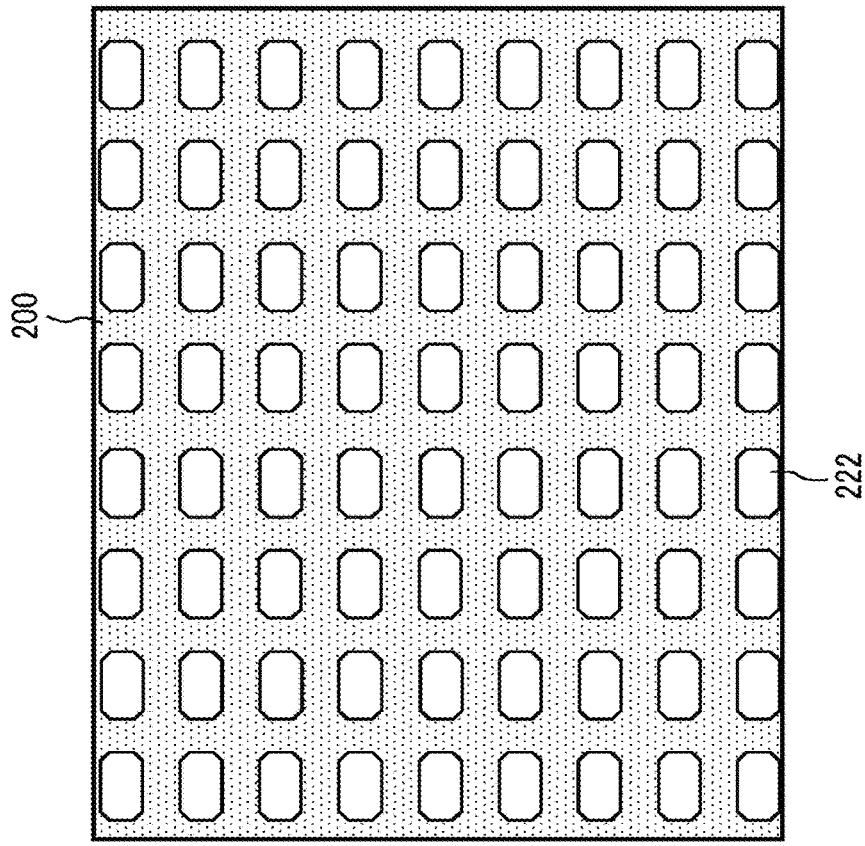

FIGS. 24A and 24B are diagrams illustrating the bonding pattern provided on the metal wiring layer 200 and the void pattern provided on the subframe 150, respectively, in the seventh embodiment for explaining the ratio between the slots and the voids. FIGS. 24A and 24B respectively illustrate a part of the metal wiring layer 200 of the actuator substrate 120 and a part of the subframe 150 that are bonded to each other.

As described above, when foreign matter is present on the solid film occupying a large area of the metal wiring layer 200, the foreign matter is caught and trapped in a void pattern of the subframe 150 with an adhesive at the time of bonding the subframe to the solid film with the adhesive, reducing the yield of the actuator substrate as the electromechanical transducer element.

Therefore, in the present embodiment, the bonding between the actuator substrate (piezoelectric element substrate) having the metal wiring layer 200 on which a plurality of slots with an identical shapes are regularly arranged and the subframe 150 (another substrate) having a plurality of voids having the same shape as the slots is performed under the following conditions (1) and (2).

(1) At the bonding interface, the total area of the slots 222 on the actuator is equal to or larger than the total area of the voids 154 on the subframe.

(2) The actuator and the subframe are bonded to each other so that the plurality of slots formed in the bonding region 220 on the actuator overlaps with the plurality of voids on the subframe (so that their shapes match each other).

In this way, any inconvenience that occurs at the bonding interface between the metal wiring layer 200 and the subframe 150 is reduced.

With respect to the above-described condition (1), it is particularly preferable that the total area of the voids 154 in the void pattern of the subframe 150 be half (½) of the total area of the slots 222 in the bonding pattern of the metal wiring layer 200 of the actuator, as is the case illustrated in FIGS. 24A and 24B.

Due to the condition (1), the bonding surface (excluding the voids) of the subframe can surely cover the bonding surface (excluding the slots) of the metal wiring layer, thereby securing the bonding strength.

In addition, due to the condition (2), the accuracy in coating the bonding surface of the metal wiring layer with the bonding surface on the subframe is improved, thereby improving the bonding strength. Furthermore, foreign matter present on the metal wiring layer is not entrapped in the subframe, improving the yield.

Next, a modified example of the present embodiment is described below.

In the modified example of the present embodiment, the bonding pattern provided in the bonding region 220 of the actuator substrate 120 and the void pattern provided in the subframe 150 are further made to satisfy the following condition (3).

(3) The area of the bonding surface (excluding the voids) on the subframe is increased stepwise for each divided region toward the inner region where the piezoelectric elements are formed (e.g., the piezoelectric element formation region 46 in FIG. 23).

Figure 25B:
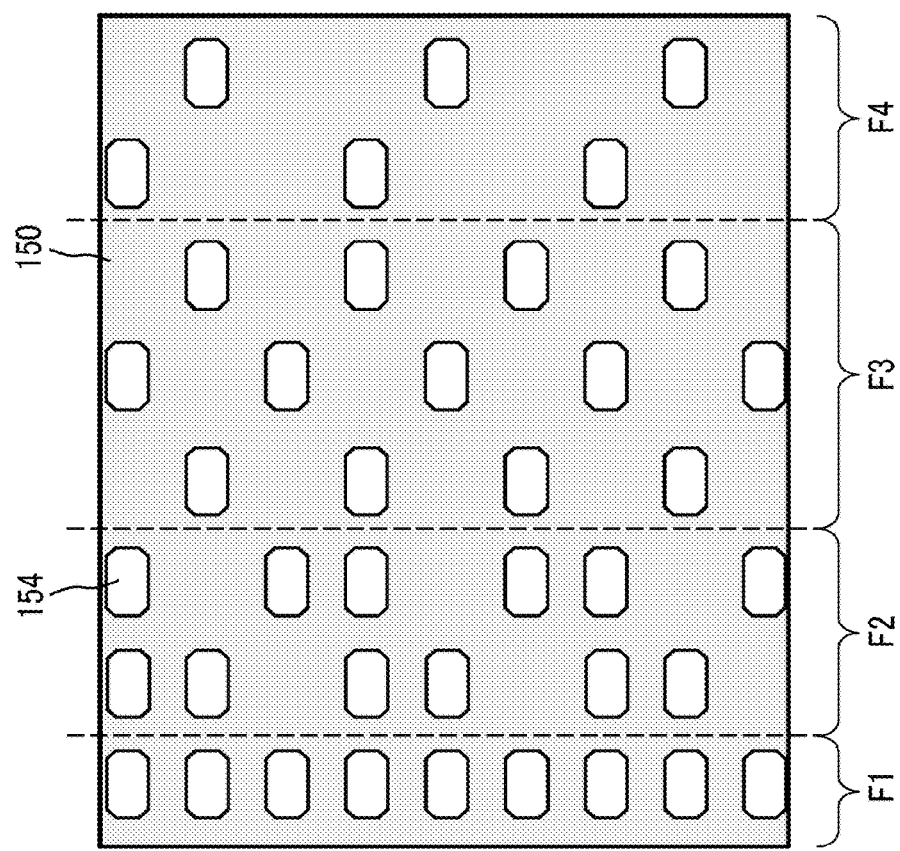
FIGS. 25A and 25B are diagrams illustrating a modified example of the seventh embodiment.
Figure 25A:
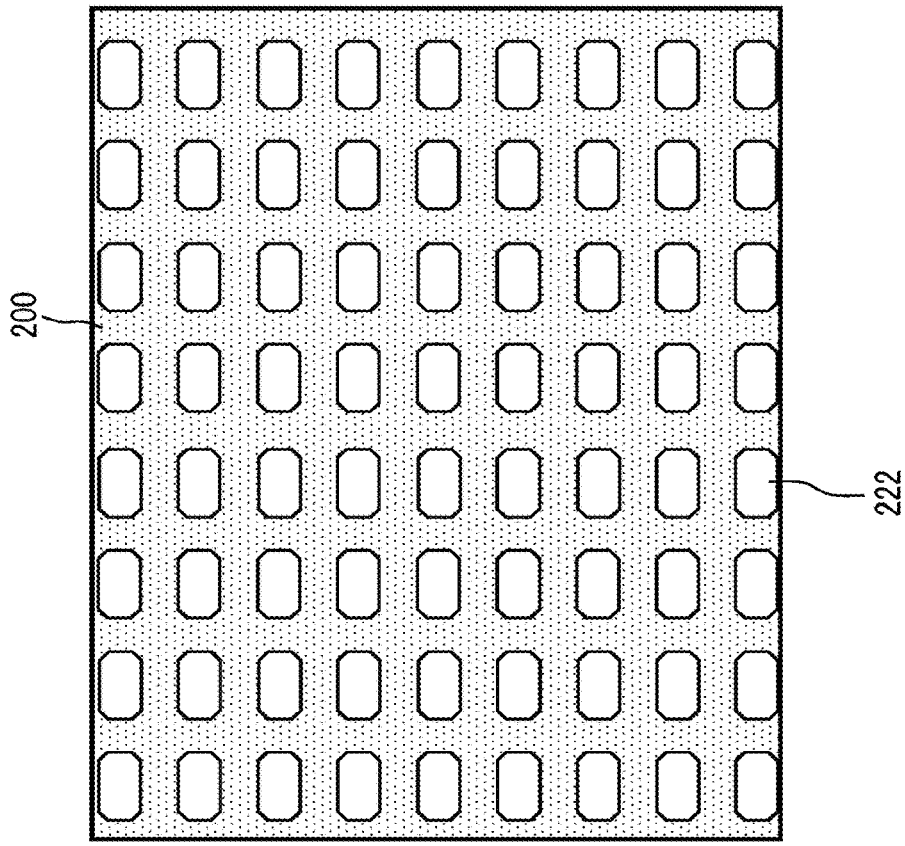

FIGS. 25A and 25B are diagrams illustrating the bonding pattern provided on the metal wiring layer 200 of the actuator substrate 120 and the void pattern provided on the subframe 150, respectively, in the modified example of the present embodiment, which illustrate a part of the bonding region 220 in FIG. 23. Similar to FIGS. 24A and 24B, FIGS. 25A and 25B illustrate the bonding pattern and the void pattern, respectively.

In FIG. 25B, the bonding region is divided into four regions F1 to F4.

In FIG. 25B, the number of the voids 154 in the void pattern formed on the bonding surface of the subframe 150 is reduced stepwise for each divided region toward the inner region where the piezoelectric element formation region 46 is disposed. Thus, due to the condition (3), the area of the bonding surface excluding the voids is increased stepwise.

In FIG. 25B, in the outermost portion of the bonding region 220, that is, in the region F1 farthest from the piezoelectric element formation region 46, the number of the voids 154 which are arranged in the direction orthogonal to the nozzle array direction in the void pattern of the subframe 150 is equal to the number of the slots 222 in the bonding pattern provided in the bonding region 220 illustrated in FIG. 25A. Further, in the bonding region 220, the ratio between the number of the voids 154 present in the void pattern and the number of the voids 154 having been omitted to enlarge the bonding surface is changed stepwise, i.e., to 2:1 in the region F2, to 1:1 in the region F3, and to 1:2 in the region F4, toward the inner region where the piezoelectric element formation region 46 is disposed.

The number of the divided regions is preferably 3 to 4. However, the ratios, the number of regions to which the respective ratios are applied, and the area of the regions are not limited to as described above. It is sufficient that the bonding surface (excluding the voids) of the subframe 150 is gradually increased stepwise for each divided region toward the inner region where the piezoelectric element formation region 46 is disposed.

The bonding region on the subframe is not necessarily equally divided into four parts and can be divided into regions with arbitrary sizes. For example, the region may be divided according to the presence ratio (thinning ratio) of the voids 154 in the void pattern in each region. The void area in each region is determined to confirm whether or not the presence ratio is increased.

In FIG. 25B, the bonding region is divided into multiple regions with different sizes. Assuming that the voids 154 arranged in the direction orthogonal to the nozzle array direction forms one row, the region F1 includes one row, the regions F2 and F4 each include two rows, and the region F3 includes three rows. In a region including a plurality of rows, the positions where the void 154 is omitted may be different between adjacent rows to distribute the voids 154.

In the modified example of the present embodiment, the area of the bonding surface of the subframe 150 (another substrate) that bonds to the bonding pattern of the metal wiring layer 200 (piezoelectric element substrate) is increased stepwise toward the region where the piezoelectric elements are disposed, in other words, the area of the voids 154 is increased toward the outer edge of the subframe 150. Further, it is preferable that the voids 154 provided in the outermost edge of the subframe 150 be in the same number and at the same positions as the slots 222 of the bonding pattern of the metal wiring layer 200 to be bonded.

The modified example of the present embodiment exerts the following effects: securing the bonding strength due to the condition (1); and improving the bonding yield in addition to the bonding strength due to the condition (2). In addition, due to the condition (3), the sealing property between the actuator and the subframe can be further improved in a region close to the region where the piezoelectric element formation region 46 is disposed in the bonding region 220. As a result, in the liquid discharge head mounting the piezoelectric element substrate including the piezoelectric elements, ingress of liquid into the piezoelectric element formation region 46 including wiring patterns is prevented, improving protection and reliability of the piezoelectric elements.

Note that, in the bonding region according to the modified example of the present embodiment, the direction from either the bonding region 220-1 disposed along the direction orthogonal to the nozzle array direction or the bonding region 220-2 disposed along the nozzle array direction, as illustrated in FIG. 7, toward the region where the piezoelectric element formation region 46 is disposed is defined as the inward direction.

According to the present embodiment, the occurrence of film peeling is prevented during driving, and reliability of the piezoelectric element substrate is improved.

Other Embodiments

The liquid discharge head including the piezoelectric element substrate according to an embodiment of the present invention as an actuator substrate has been described above with reference to FIGS. 1 to 25.

The piezoelectric element substrate according to an embodiment of the present invention may further include another substrate in addition to the plurality of piezoelectric elements and the metal wiring layer. As an example, the piezoelectric element substrate may further include a subframe (holding substrate) as said another substrate, in which the subframe and at least the bonding region are bonded to each other.

On the other hand, the piezoelectric element substrate according to an embodiment of the present invention may not include another substrate and may include only a plurality of piezoelectric elements in each of which a first electrode, a piezoelectric body, and a second electrode are laminated. In addition, the piezoelectric element substrate and another substrate may be bonded to each other to form a bonded substrate.

The piezoelectric element substrate according to an embodiment of the present invention may use each of the plurality of piezoelectric elements as a sensor.

In the various configuration examples of the piezoelectric element substrate described above, the plurality of piezoelectric elements function as individualized electromechanical transducer elements.

A liquid discharge unit and a liquid discharge apparatus according to some embodiments of the present invention are described in detail below.

The liquid discharge unit according to an embodiment of the present invention includes the liquid discharge head according to an embodiment of the present invention.

The liquid discharge unit may further include at least one of: a head tank configured to store a liquid to be supplied to the liquid discharge head; a carriage mounting the liquid discharge head; a supply mechanism configured to supply the liquid to the liquid discharge head; a maintenance mechanism configured to maintain the liquid discharge head; and a main-scanning moving mechanism configured to move the liquid discharge head in a main-scanning direction.

The liquid discharge apparatus according to an embodiment of the present invention includes the liquid discharge head according to an embodiment of the present invention or the liquid discharge unit according to an embodiment of the present invention.

Figure 26:
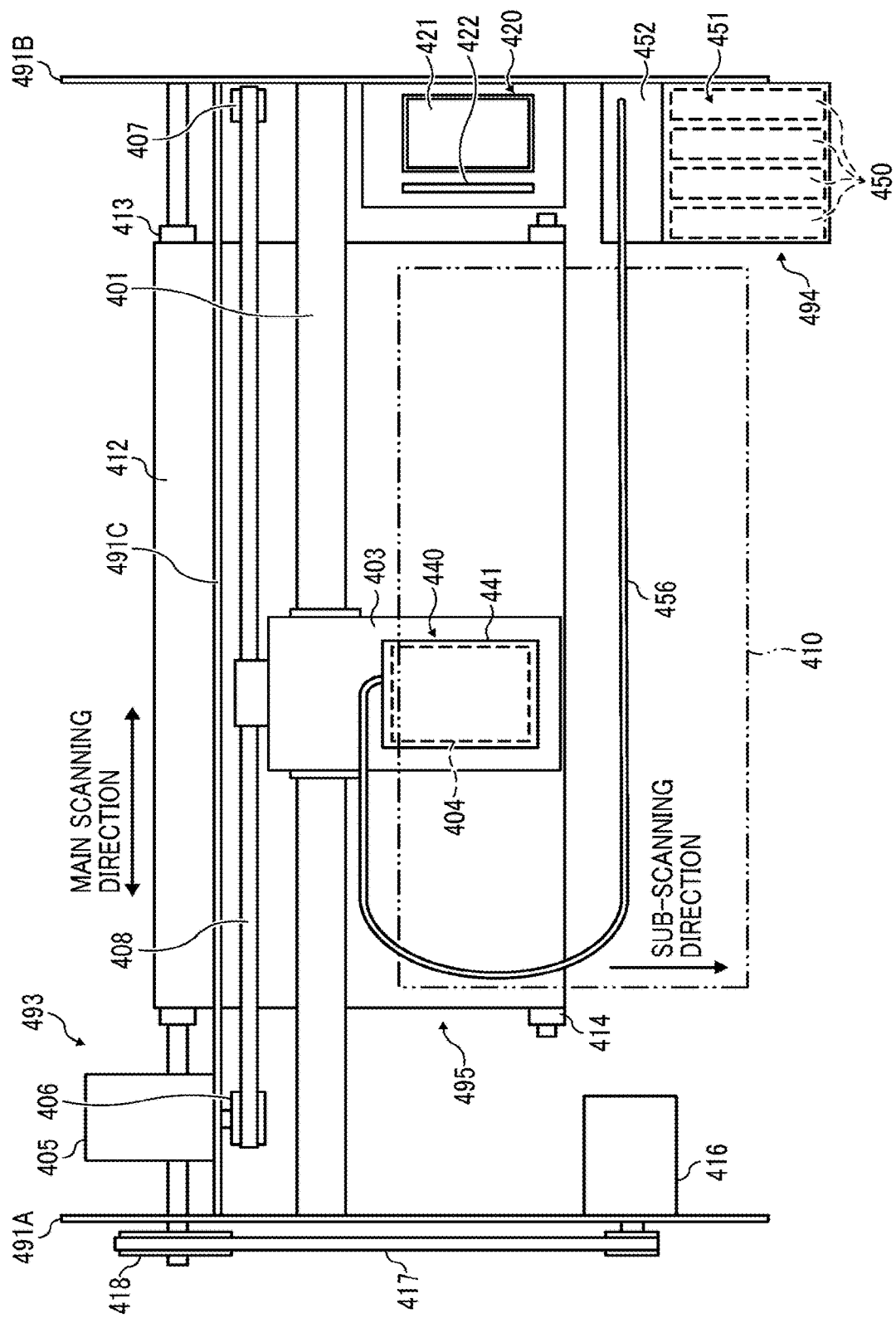
FIG. 26 is a plan view of a main part of a liquid discharge apparatus according to an embodiment of the present invention.
Figure 27:
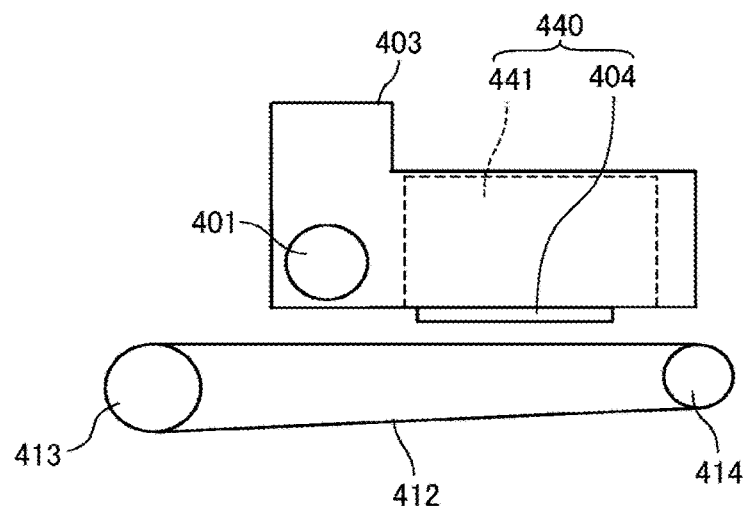
FIG. 27 is a side view of the main part of the liquid discharge apparatus.

The liquid discharge apparatus according to an embodiment of the present invention is described in detail below with reference to FIGS. 26 and 27. FIG. 26 is a plan view of a main part of the liquid discharge apparatus. FIG. 27 is a side view of the main part of the liquid discharge apparatus.

This apparatus is a serial-type apparatus in which a main-scanning moving mechanism 493 reciprocates a carriage 403 in the main scanning direction. The main-scanning moving mechanism 493 includes a guide 401, a main-scanning motor 405, and a timing belt 408. The guide 401 is bridged between left and right side plates 491A and 491B to moveably hold the carriage 403. The main-scanning motor 405 reciprocates the carriage 403 in the main-scanning direction via the timing belt 408 bridged between a drive pulley 406 and a driven pulley 407.

The carriage 403 carries a liquid discharge unit 440 according to an embodiment of the present invention including a liquid discharge head 404 and a head tank 441. The liquid discharge head 404 of the liquid discharge unit 440 discharges color liquids of, for example, yellow (Y), cyan (C), magenta (M), and black (K). The liquid discharge head 404 has nozzle arrays each including multiple nozzles 11 arranged in the sub-scanning direction that is orthogonal to the main-scanning direction. The liquid discharge head 404 is mounted on the liquid discharge unit 440 with its discharging direction downward.

A supply mechanism 494 disposed outside the liquid discharge head 404 is configured to supply liquid stored in a liquid cartridge 450 to the head tank 441 of the liquid discharge head 404.

The supply mechanism 494 includes a cartridge holder 451 for holding the liquid cartridge 450, a tube 456, and a liquid feed unit 452 including a liquid feed pump. The liquid cartridge 450 is detachably mounted on the cartridge holder 451. The liquid feed unit 452 feeds the liquid from the liquid cartridge 450 to the head tank 441 via the tube 456.

This apparatus further includes a conveyance mechanism 495 to convey a sheet 410. The conveyance mechanism 495 includes a conveyance belt 412 serving as a conveyer and a sub-scanning motor 416 configured to drive the conveyance belt 412.

The conveyance belt 412 adsorbs the sheet 410 and conveys it to the position facing the liquid discharge head 404. The conveyance belt 412 is an endless belt stretched between a conveyance roller 413 and a tension roller 414. The conveyance belt 412 adsorbs the sheet 410 by electrostatic adsorption or suction.

The conveyance belt 412 circumferentially moves in the sub-scanning direction as the conveyance roller 413 is rotationally driven by the sub-scanning motor 416 via a timing belt 417 and a timing pulley 418.

On one side of the carriage 403 in the main-scanning direction, a maintenance mechanism 420 for maintaining the liquid discharge head 404 is disposed lateral to the conveyance belt 412.

The maintenance mechanism 420 includes a cap 421 to cap the nozzle surface (on which the nozzles 11 are formed) of the liquid discharge head 404 and a wiper 422 to wipe the nozzle surface.

The main-scanning moving mechanism 493, the supply mechanism 494, the maintenance mechanism 420, and the conveyance mechanism 495 are installed onto a housing including the side plates 491A and 491B and a back plate 491C.

In this apparatus, the sheet 410 is fed and adsorbed to the conveyance belt 412 and conveyed in the sub-scanning direction by the circumferential movement of the conveyance belt 412.

The liquid discharge head 404 is driven in response to an image signal while moving the carriage 403 in the main-scanning direction to discharge the liquid onto the sheet 410 not in motion, thereby recording an image.

Provided with the liquid discharge head according to an embodiment of the present invention, this apparatus reliably provides high quality images.

Figure 28:
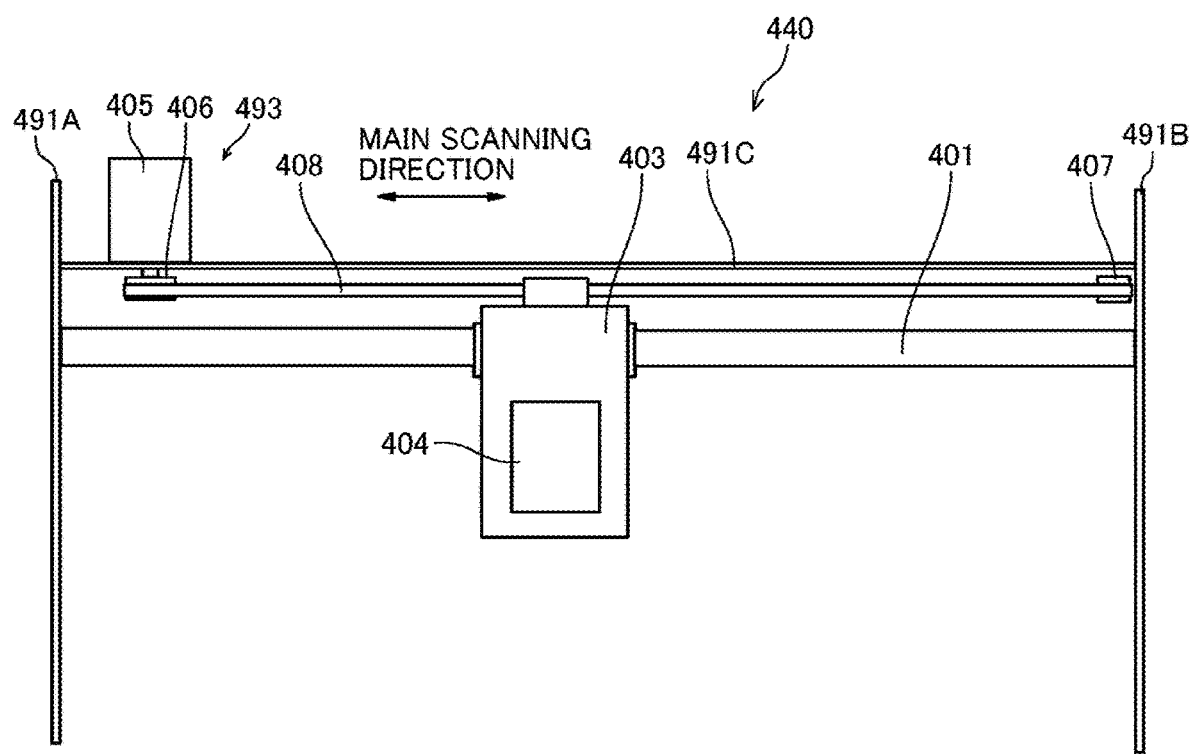
FIG. 28 is a plan view of a main part of a liquid discharge unit according to an embodiment of the present invention.

Next, another example of the liquid discharge unit according to an embodiment of the present invention is described below with reference to FIG. 28. FIG. 28 is a plan view of a main part of the liquid discharge unit.

This liquid discharge unit includes the housing including the side plates 491A and 491B and the back plate 491C, the main-scanning moving mechanism 493, the carriage 403, and the liquid discharge head 404 of the above-described of the liquid discharge apparatus.

The liquid discharge unit may further include at least one of the maintenance mechanism 420 and the supply mechanism 494, which may be attached to the side plate 491B.

Figure 29:
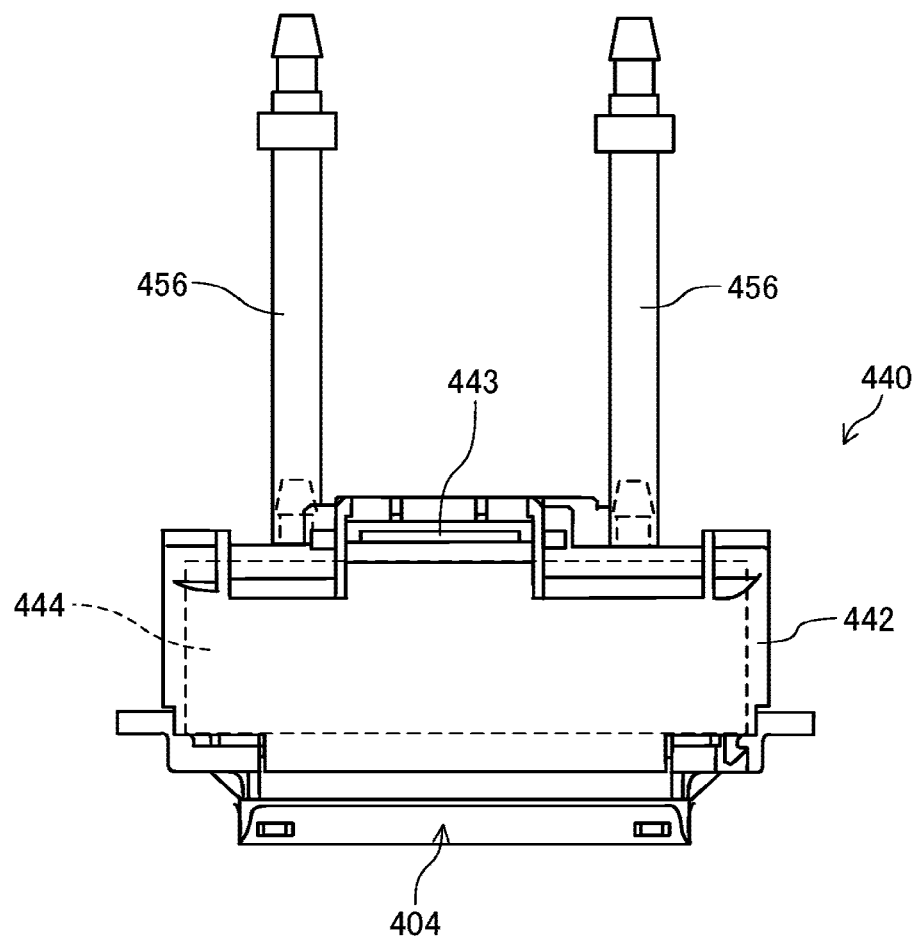
FIG. 29 is a front view of a liquid discharge unit according to an embodiment of the present invention.

Next, another example of the liquid discharge unit according to an embodiment of the present invention is described below with reference to FIG. 29. FIG. 29 is a front view of a main part of the liquid discharge unit.

This liquid discharge unit includes the liquid discharge head 404 to which a channel component 444 is attached and the tube 456 connected to the channel component 444.

The channel component 444 is disposed inside a cover 442. The liquid discharge unit may include the head tank 441 instead of the channel component 444. A connector 443 for electrically connecting to the liquid discharge head 404 is provided on the channel component 444.

In the present disclosure, a "liquid discharge apparatus" refers to an apparatus including a liquid discharge head or a liquid discharge unit, configured to discharge a liquid by driving the liquid discharge head. Examples of the liquid discharge apparatus include an apparatus capable of discharging a liquid to a substance to which the liquid is adherable and another apparatus capable of discharging a liquid toward a gas or into a liquid.

The liquid discharge apparatus may further optionally include units relating to feeding, conveying, or ejecting of the substance to which the liquid is adherable, a pretreatment unit, and/or an aftertreatment unit.

Specific examples of the liquid discharge apparatus include an image forming apparatus configured to discharge an ink onto a sheet to form an image thereon, and a three-dimensional object forming apparatus configured to discharge an object forming liquid onto a powder lamination layer to form a three-dimensional object.

In addition, the liquid discharge apparatus is not limited to those producing merely meaningful visible images such as texts and figures with the discharged liquid. For example, the liquid discharge apparatus can produce patterns like geometric design and three-dimensional images.

The above-described "substance to which a liquid is adherable" refers to a substance to which a liquid is at least temporarily adherable, allowing the liquid either to fix thereon or to permeate after the adhesion. Specific examples of such substances include, but are not limited to, recording media (e.g., paper sheet, recording sheet, film, cloth), electronic parts (e.g., electronic substrate, piezoelectric element), powder layers, organ models, and test cells.

The substance to which a liquid is adherable may be made of any material to which a liquid is at least temporarily adherable, such as paper, thread, fiber, cloth, laser, metal, plastic, glass, wood, ceramic, building materials such as wall paper and flooring material, and textiles for clothing.

Examples of the "liquid" include ink, treatment liquid, DNA sample, resist, pattern material, binder, modeling liquid, and solution or liquid dispersion containing amino acid, protein, or calcium.

Examples of the liquid discharge apparatus further include an apparatus in which a liquid discharge head and a substance to which a liquid is adherable are movable relative to each other, but are not limited thereto. Specific examples of such an apparatus include a serial-type apparatus in which a liquid discharge head is movable and a line-type apparatus in which a liquid discharge head is unmovable.

Examples of the liquid discharge apparatus further include: a treatment liquid applying apparatus that discharges a treatment liquid onto a paper sheet to apply the treatment liquid to the surface of the paper sheet, for reforming the surface of the paper sheet; and an injection granulation apparatus that injects a composition liquid, in which a raw material is dispersed in a solution, through a nozzle to granulate fine particle of the raw material.

In the present disclosure, a "liquid discharge unit" refers to a liquid discharge head integrated with functional components/mechanisms, i.e., an aggregation of components related to liquid discharge. For example, the liquid discharge unit may include a combination of a liquid discharge head with at least one of a head tank, a carriage, a supply mechanism, a maintenance mechanism, and a main-scanning moving mechanism.

When it is stated that a liquid discharge head and functional components/mechanisms are integrated with each other, it refers to a case in which the liquid discharge head and the functional components/mechanisms are secured to each other by means of fastening, bonding, or engaging, or another case in which one of the liquid discharge head and the functional components/mechanisms is movably supported by the other one of them. In addition, it also refers to a case in which the liquid discharge head and the functional components/mechanisms are detachably attached to each other.

Examples of the liquid discharge unit include the liquid discharge unit 440 in which a liquid discharge head and a head tank are integrated, as illustrated in FIG. 27. In this case, the liquid discharge head and the head tank may be connected to each other with a tube. Furthermore, a filter unit may be disposed between the head tank and the liquid discharge head in the liquid discharge unit.

Examples of the liquid discharge unit further include those in which a liquid discharge head and a carriage are integrated.

Examples of the liquid discharge unit further include those in which a liquid discharge head and a scanning moving mechanism are integrated in such a manner that the liquid discharge head is movably held by a guide that constitutes a part of the scanning moving mechanism. Examples of the liquid discharge unit further include those in which a liquid discharge head, a carriage, and a main-scanning moving mechanism are integrated, as illustrated in FIG. 28.

Examples of the liquid discharge unit further include those in which a liquid discharge head, a carriage, and a maintenance mechanism are integrated in such a manner that the liquid discharge head is mounted on the carriage and a cap of the maintenance mechanism is secured to the carriage.

Examples of the liquid discharge unit further include those in which a liquid discharge head and a supply mechanism are integrated in such a manner that a head tank or channel component is mounted on the liquid discharge head and a tube is connected to the liquid discharge head, as illustrated in FIG. 29.

Examples of the main-scanning moving mechanism include a single guide. Examples of the supply mechanism include a single tube and a single loading port.

The liquid discharge head is not limited in the type of pressure generator used. For example, the above-described piezoelectric actuator (which may use a laminated piezoelectric element), a thermal actuator using an electrothermal transducer such as a heating resistor, and an electrostatic actuator comprising a vibration plate and a counter electrode.

In the present disclosure, "image forming", "recording", "printing", "molding", etc. are treated as synonymous terms.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. A piezoelectric element substrate, comprising:
a substrate member;
a plurality of piezoelectric elements on the substrate member, each of the piezoelectric elements including a first electrode, a piezoelectric body, and a second electrode;
a plurality of wiring patterns in a first region on one side of the substrate member on which the plurality of piezoelectric elements is disposed, the wiring patterns connected to the corresponding piezoelectric elements; and a bonding pattern occupying a second region different from the first region of the wiring patterns on the one side of the substrate member, the bonding pattern to be bonded to another substrate directly or via an insulating film, the bonding pattern made of a metal layer having a plurality of slots, in which no metal is present, arranged within the metal layer of the bonding pattern.

2. The piezoelectric element substrate according to claim 1, wherein the slots have an identical shape and are regularly arranged.

3. The piezoelectric element substrate according to claim 1, wherein the slots are arranged in a grid shape.

4. A bonded substrate, comprising:
a piezoelectric element substrate including:
   a substrate member;
   a plurality of piezoelectric elements on the substrate member, each of the piezoelectric elements including a first electrode; a piezoelectric body, and a second electrode;
   a plurality of wiring patterns in a first region on one side of the substrate member on which the plurality of piezoelectric elements is disposed, the wiring patterns connected to the corresponding piezoelectric elements; and
   a bonding pattern occupying a second region different from the first region of the wiring patterns on the one side of the substrate member, the bonding pattern made of a metal layer having a plurality of slots, in which no metal is present, arranged within the metal layer of the bonding pattern; and
another substrate bonded to the bonding pattern of the piezoelectric element substrate directly or via an insulating film.

5. The bonded substrate according to claim 4, wherein the slots have an identical shape and are regularly arranged.

6. The bonded substrate according to claim 4, wherein the slots are arranged in a grid shape.

7. The bonded substrate according to claim 4, wherein said another substrate has a plurality of voids on a surface bonded to the bonding pattern, the voids have a same shape as the slots, and the slots and the corresponding voids overlap with each other.

8. The bonded substrate according to claim 7, wherein a total area of the slots is equal to or larger than a total area of the voids.

9. The bonded substrate according to claim 7, wherein at least one of the voids is a liquid supply port.

10. The bonded substrate according to claim 7, wherein a total area of voids of the voids in said another substrate increases from a region facing a region of the piezoelectric element substrate in which the piezoelectric elements are disposed toward an outer edge of said another substrate.

11. The bonded substrate according to claim 10, wherein, in an outermost edge of said another substrate, the voids include voids in a same number and at identical positions as the slots on the piezoelectric element substrate bonded.

12. The bonded substrate according to claim 4, wherein the substrate member is a vibration plate.

13. The bonded substrate according to claim 4, wherein said another substrate is a holding substrate.

14. A liquid discharge head comprising:
the bonded substrate according to claim 4.

15. A liquid discharge unit comprising:
the liquid discharge head according to claim 14.

16. The liquid discharge unit according to claim 15, further comprising at least one of:
   a head tank configured to store a liquid to the supplied to the liquid discharge head;
   a carriage mounting the liquid discharge head;
   a supply mechanism configured to supply the liquid to the liquid discharge head;
   a maintenance mechanism configured to maintain the liquid discharge head; and
   a main-scanning moving mechanism configured to move the liquid discharge head in a main-scanning direction.

17. A liquid discharge apparatus comprising the liquid discharge head according to claim 16.

18. The piezoelectric element substrate of claim 1, wherein the bonding pattern is formed in an outer peripheral region of the piezoelectric element.

19. The bonded substrate of claim 4, further comprising an electrode power supply wiring pattern to which a driver IC is connected.

* * * * *